United States Patent
Shimizu

(10) Patent No.: US 12,001,396 B2
(45) Date of Patent: Jun. 4, 2024

(54) FILE STORAGE AND COMPUTER SYSTEM

(71) Applicant: Hitachi, Ltd., Tokyo (JP)

(72) Inventor: Tomoki Shimizu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 316 days.

(21) Appl. No.: 17/482,642

(22) Filed: Sep. 23, 2021

(65) Prior Publication Data

US 2022/0197864 A1 Jun. 23, 2022

(30) Foreign Application Priority Data

Dec. 23, 2020 (JP) .................................. 2020-214067

(51) Int. Cl.
*G06F 16/00* (2019.01)
*G06F 16/16* (2019.01)
*G06F 16/174* (2019.01)
*G06F 16/182* (2019.01)
*H04L 67/06* (2022.01)

(52) U.S. Cl.
CPC .......... *G06F 16/16* (2019.01); *G06F 16/1744* (2019.01); *G06F 16/1827* (2019.01); *H04L 67/06* (2013.01)

(58) Field of Classification Search
None
See application file for complete search history.

(56) References Cited

U.S. PATENT DOCUMENTS

| | | | | |
|---|---|---|---|---|
| 9,063,663 | B2 * | 6/2015 | Suzuki | G06F 12/0246 |
| 2014/0223029 | A1 * | 8/2014 | Bhaskar | H03M 7/4006 |
| | | | | 709/247 |
| 2015/0339314 | A1 * | 11/2015 | Collins | G06F 16/183 |
| | | | | 707/693 |
| 2019/0215358 | A1 | 7/2019 | Kobayashi et al. | |

FOREIGN PATENT DOCUMENTS

WO 2018154698 A1 8/2018

* cited by examiner

*Primary Examiner* — Tuankhanh D Phan
(74) *Attorney, Agent, or Firm* — MATTINGLY & MALUR, PC

(57) ABSTRACT

In a file storage that is coupled to a cloud storage storing data and manages a file, the cloud storage compresses and stores the data, and the file storage includes a processor. When data of a part of a file held in the file storage is updated, the processor is configured to compress updated update part data so that the update part data is in a compressed state and transmit the update part data in the compressed state to the cloud storage, and cause the cloud storage to replace the updated part of the file with the update part data and to store a range including the update part data in a compressed state in the cloud storage.

8 Claims, 25 Drawing Sheets

| | | | | | 258A (258) |
|---|---|---|---|---|---|
| 2581 | 2582 | 2583 | 2584 | 2585 | 2586 |
| Start unprocessed file offset | End unprocessed file offset (unprocessed chunk size) | Chunk file identifier | Chunk file size | Encoding scheme | Chunk hash value |
| 0 | 100KB (100KB) | /file/a | 50KB | A compression | 000 |
| 100KB | 150KB (50KB) | /file/b | 25KB | A compression | 111 |
| 150KB | 300KB (150KB) | /file/c | 150KB | Unprocessed | AAA |
| 300KB | 400KB (100KB) | /file/d | 120KB | B encryption | BBB |
| ⋮ | ⋮ | ⋮ | ⋮ | ⋮ | ⋮ |

| Start unprocessed file offset | End unprocessed file offset (unprocessed chunk size) | | Start encoded file offset | End encoded file offset (encoded chunk size) | | Encoding scheme | Chunk hash value |
|---|---|---|---|---|---|---|---|
| 2581 | 2582 | | 2591 | 2592 | | 2585 | 2586 |
| 0 | 100KB | (100KB) | 0 | 50KB | (50KB) | A compression | 000 |
| 100KB | 150KB | (50KB) | 50KB | 75KB | (25KB) | A compression | 111 |
| 150KB | 300KB | (150KB) | 75KB | 150KB | (75KB) | A compression | CCC |
| 300KB | 400KB | (100KB) | 150KB | 200KB | (50KB) | A compression | DDD |
| ⋮ | ⋮ | | ⋮ | ⋮ | | ⋮ | ⋮ |

FIG. 6

| Handled file file identifier | Chunk map file identifier | Storage state |
|---|---|---|
| /file1 | /file1/map | Divided |
| /file3 | /file3/map | Divided |
| /file5 | /file5/map | Coupled |
| ⋮ | ⋮ | ⋮ |

FIG. 7

FILE STORAGE AND COMPUTER SYSTEM

CROSS-REFERENCE TO RELATED APPLICATIONS

This application claims priority from Japanese Patent Application No. 2020-214067 filed Dec. 23, 2020. The entire content of the priority application is incorporated herein by reference.

BACKGROUND

The present disclosure relates to a file storage or the like for managing files and a technology for storing a managed file to a data storage and utilizing the managed file.

Data of files managed in a file storage is stored in a cloud storage (an example of a data storage) connected via a network for the use of remote backup, migration, file virtualization, data integration, or the like. In such a case, for example, the file storage stores data in a cloud storage in units of files.

When data is stored for use in a cloud storage, a decrease in a communication cost or a time required for communication between a file storage and the cloud storage is desired. Accordingly, it is important to reduce an amount of data transferred between the file storage and the cloud storage. In particular, a network used between the cloud storage and the file storage is a WAN (Wide Area Network), and, in general, since the WAN has a narrow communication bandwidth, it is important to reduce the amount of data.

In consideration thereof, it is common practice to reduce a data amount during a file update by dividing the file into a plurality of parts and transferring a part that includes a portion having been updated upon the update of the file to cloud storage.

For example, WO 2018/154698 discloses a technology for retransmitting data efficiently in a case where a file is divided into parts and transferred, and when the transferred parts are updated.

As a technology for reducing the amount of data to be transferred, a technology for reducing the amount of data by compressing the data of a file is known.

As a technology for reducing the amount of data stored in a cloud storage, a technology for reducing the amount of data by compressing the data to be stored is known.

To inhibit data from being leaked from a cloud storage, a technology for encrypting data of a file and storing the data in the cloud storage is known.

SUMMARY

For example, in a case where a compressed file is stored in a cloud storage and partial data of the file becomes necessary on a file storage side, processing of reading and expanding the entire file on the file storage side is performed to acquire necessary data. For example, in this case, since it is necessary to transfer the entire file, there is a problem that the amount of data in communication is large.

In contrast, for a compressed file, the technology of WO 2018/154698 cannot be used without modification. For example, when a file is partially updated, parts thereof cannot be specified in the compressed file and the parts of the file have to be expanded. Therefore, the technology of WO 2018/154698F cannot be used without modification.

The present disclosure has been devised in view of the foregoing circumstances and an objective of the present disclosure is to provide a technology capable of reducing an amount of data to be transferred between a file storage and a data storage and reducing an amount of data to be stored in a data storage.

To achieve the foregoing objective, according to an aspect of the present invention, a file storage is coupled to a data storage storing data and manages a file, wherein the data storage compresses and stores the data, and the file storage include a processor; the processor is configured to, when data of a part of a file stored in the file storage is updated, compress updated update part data so that the update part data is in a compressed state and transmit the update part data in the compressed state to the data storage, and cause the data storage to replace the updated part of the file with the update part data and to store a range including the update part data in a compressed state.

BRIEF DESCRIPTION OF THE DRAWINGS

FIG. 5 is a diagram illustrating a configuration of a chunk map for chunk individual storage according to the embodiment;

FIG. 6 is a diagram illustrating a configuration of a chunk map for chunk coupled storage map according to the embodiment;

FIG. 7 is a diagram illustrating a configuration of a chunk map according to the embodiment;

DETAILED DESCRIPTION OF THE EMBODIMENT

Embodiments will be described with reference to the drawings. The embodiments to be described below do not limit the invention of the claims, and not all the elements described in the embodiments or all combinations of the elements are not necessarily essential to solutions of the present invention.

In the following description, information will be described with expressions of the form "AAA table", but the information may be expressed with any data structure. That is, to indicate that information does not depend on a data structure, an "AAA table" can be referred to as "AAA information".

In the following description, processing performed by a "program", which is an operation entity, will be described in some cases, but the program may be executed by a processor to appropriately perform given processing while using at least one of a storage unit and an interface unit. Therefore, an operation subject for the processing may be considered as a processor (or a computer or a computer system including the processor). The program may be installed on a computer from a program source. The program source may be, for example, a program distribution server or a storage medium (for example, a portable storage medium) which can be read by a computer. In the following description, two or more programs may be realized as one program or one program may be realized as two or more programs. At least a part of processing realized by executing the program may be realized by a hardware circuit (for example, an ASIC (Application Specific Integrated Circuit) or an FPGA (Field-Programmable Gate Array)).

Figure 1:
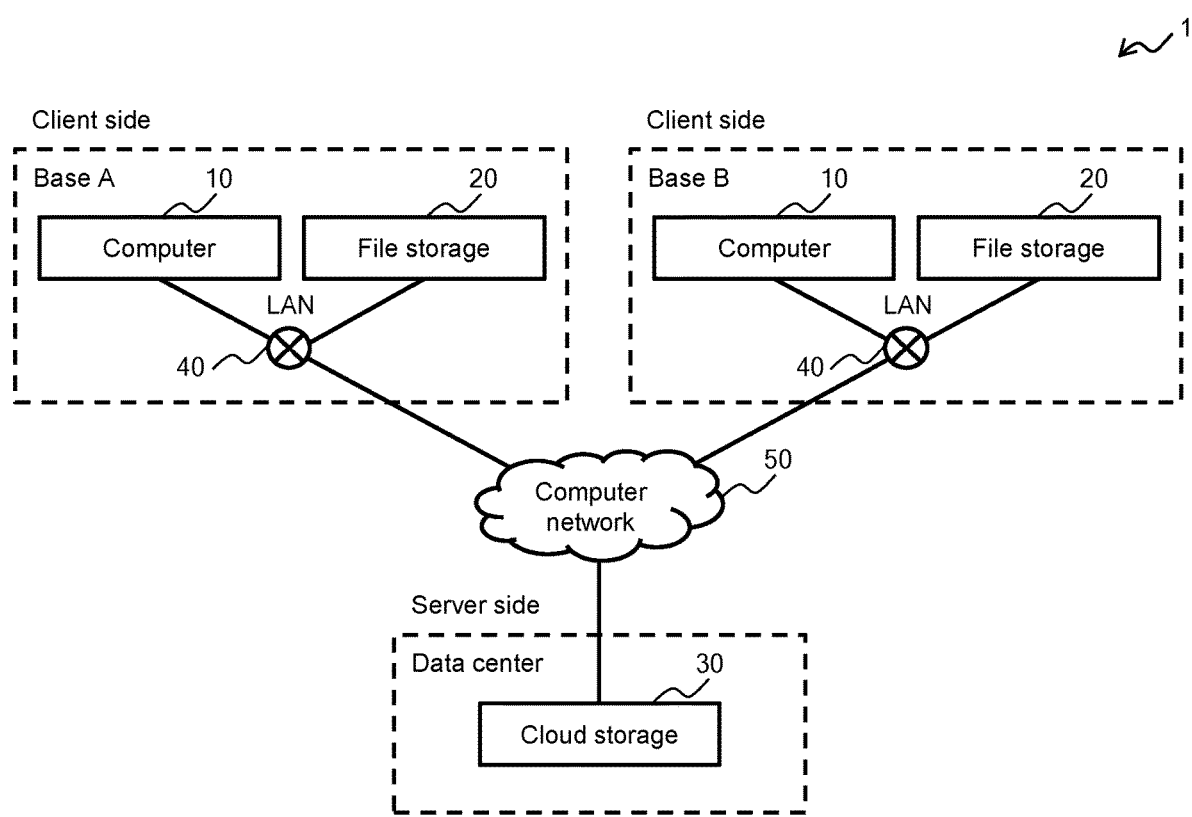
FIG. 1 is a diagram illustrating an overall configuration of a computer system according to an embodiment.

FIG. 1 is a diagram illustrating an overall configuration of a computer system according to an embodiment.

A computer system 1 includes one or more computers 10, one or more file storages 20, and a cloud storage 30 which is an example of a data storage.

The computer 10 and the file storage 20 are provided, for example, at bases (bases A and B) which are client sides and are coupled via a LAN (Local Area Network) 40 for the bases.

The computer 10 is an apparatus used by a user to execute various kinds of processing using files managed by the file storage 20. The file storage 20 includes a file system that manages files used by the computer 10.

The cloud storage 30 is provided at a data center which is a server side and is coupled to a network 50, for example. The network 50 is, for example, a WAN (Wide Area Network) and is coupled to the LAN 40 of each base.

The cloud storage 30 stores at least part of a plurality of files managed by the file storage 20.

Next, a configuration of the file storage 20 will be described in detail.

Figure 2:
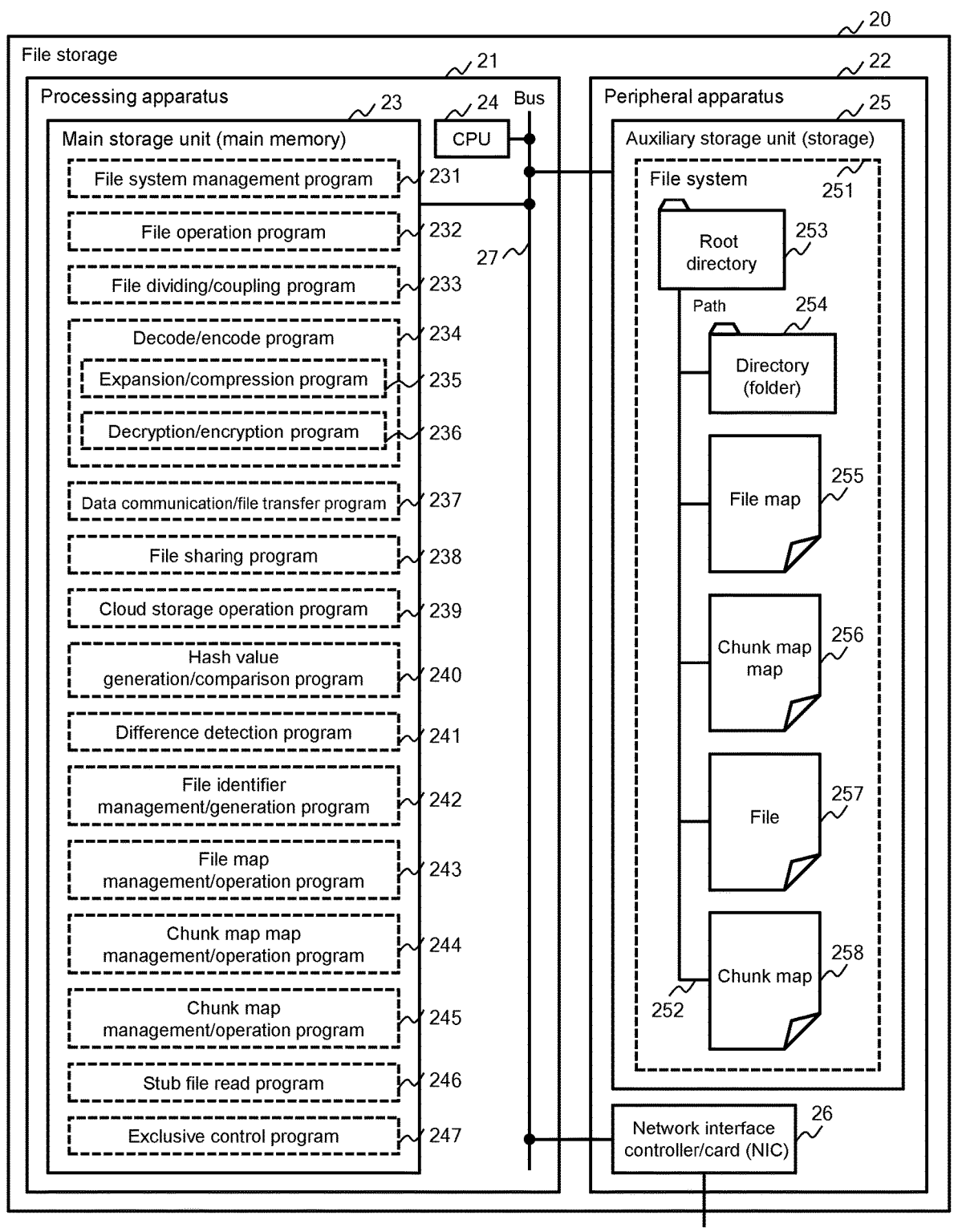
FIG. 2 is a diagram illustrating a configuration of a file storage according to the embodiment.

FIG. 2 is a diagram illustrating a configuration of the file storage according to the embodiment.

The file storage 20 is configured by, for example, a PC (Personal Computer), a mainframe, a server, or the like and includes a processing apparatus 21 and a peripheral apparatus 22. The processing apparatus 21 includes a main storage unit (a main memory) 23 and a central processing unit (CPU) 24 which is an example of a processor.

The CPU 24 performs various steps of processing in accordance with programs stored in the main storage unit 23.

The main storage unit 23 is, for example, a RAM (Random Access Memory) and stores necessary information and programs executed by the CPU 24. The main storage unit 23 includes a file system management program 231, a file operation program 232, a file dividing/coupling program 233, a decode/encode program 234, a data communication/file transfer program 237, a file sharing program 238, a cloud storage operation program 239, a hash value generation/comparison program 240, a difference detection program 241, a file identifier management/generation program 242, a file map management/operation program 243, a chunk map management/operation program 244, a chunk map management/operation program 245, a stub file read program 246, and an exclusive control program 247.

The file system management program 231 manages a file system that manages files. The file operation program 232 performs operations (create, read, update, delete, and the like) with respect to files. The file dividing/coupling program 233 divides a file into chunks and couples chunks. The decode/encode program 234 includes an expansion/compression program 235 and a decryption/encryption program 236. The expansion/compression program 235 performs expansion processing and compression processing on data. The decryption/encryption program 236 performs decode (decryption) processing for encrypted data and encryption processing for data. The data communication/file transfer program 237 performs data communication or file transfer processing via the network 50. The file sharing program 238 performs processing related to file sharing between the file storages 20 at a plurality of bases. The cloud storage operation program 239 performs processing of operating the cloud storage 30, for example, processing of issuing various commands to the cloud storage 30. The hash value generation/comparison program 240 performs processing of generating a hash value on data or processing of comparing hash values. The difference detection program 241 detects a difference between pieces of data. The file identifier management/generation program 242 generates and manages a file identifier. The file map management/operation program 243 manages a correspondence relation between a local file in the file storage 20 and data (an object or a file) of the cloud storage 30. The chunk map map management/operation program 244 performs processing of managing and operating a chunk map 256 to be described below. The chunk map management/operation program 245 performs operations (create, read, update, delete, and the like) with respect to a chunk maps 258 (258A and 258B) to be described below. The stub file read program 246 performs processing of reading a body of a file which is stubbed (a stub file) from the cloud storage 30. The exclusive control program 247 performs exclusive control when accessing to a file.

The peripheral apparatus 22 includes an auxiliary storage unit 25 which is an example of a storage unit and a NIC (Network Interface controller/Card) 26. The main storage unit 23, the CPU 24, the auxiliary storage unit 25, and the NIC 26 are coupled via a bus 27.

The auxiliary storage unit 25 is, for example, a nonvolatile storage device such as an HDD (Hard Disk Drive), a flash memory, or a block storage and stores programs executed by the CPU 24 or various kinds of data used by the CPU 24. In the embodiment, the auxiliary storage unit 25 stores information that configures a file system 251.

The file system 251 stores a root directory 253, one or more directories 254, a file map 255, a chunk map 256, a file 257, and a chunk map 258. The root directory 253, the directories 254, the file map 255, the chunk map 256, the file 257, and the chunk map 258 are associated with each other via a path 252.

The root directory 253 is information regarding a directory serving as a root of the file system (a root directory) and stores information regarding directories or files included in the root directory. The directory 254 stores information regarding directories or files that it includes.

The file map 255 stores a correspondence relation between identification information (directory information) of local files managed by the file storage 20 and identification information with which files can be specified by the cloud storage 30 (a file identifier: strictly speaking, for example, an object identifier when the cloud storage 30 is an object storage and a file identifier when the cloud storage 30 is a file storage).

The chunk map 256 is a table that manages a correspondence relation between a file identifier of files in the cloud storage 30 and an identifier of files (chunk map files) of the chunk map 258 of the files. The chunk map 256 will be described below with reference to FIG. 7. The file 257 is a file managed by the file system 251. The chunk map 258 is a table that manages an offset (positional information in a file) or the like of chunks created by dividing the file. The chunk maps 258 include a chunk map 258A for chunk individual storage that is used when chunks are individually (independently) stored in the cloud storage 30 and a chunk map 258B for chunk coupled storage that is used when chunks are coupled and stored in the cloud storage 30. The chunk maps 258 (258A and 258B) will be described below with reference to FIGS. 5 and 6.

Next, a configuration of the cloud storage 30 will be described in detail.

Figure 3:
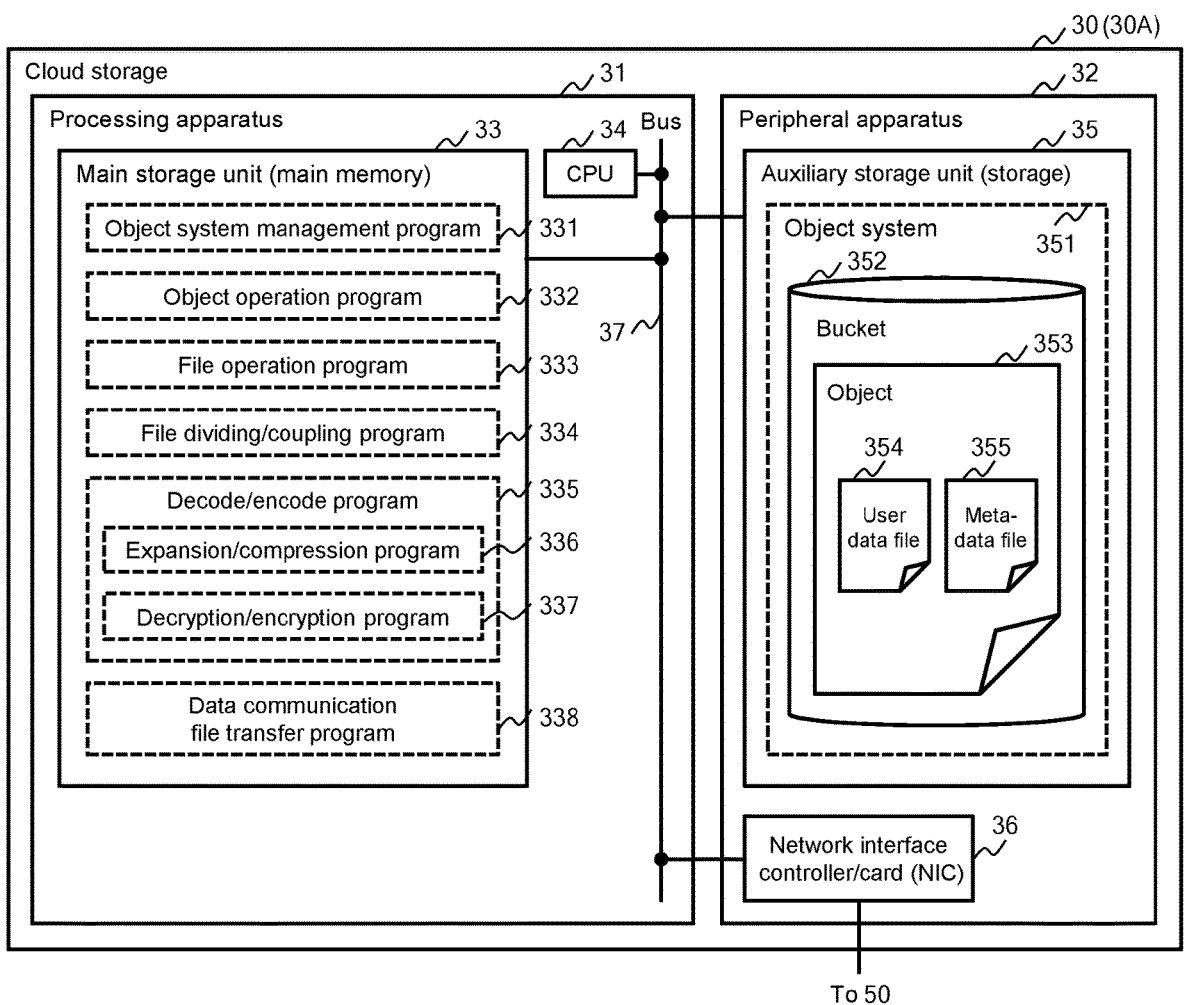
FIG. 3 is a diagram illustrating a first configuration of a cloud storage according to the embodiment.

FIG. 3 is a diagram illustrating a first configuration of the cloud storage according to the embodiment. The cloud storage 30 illustrated in FIG. 3 is configured as an object storage that manages data as an object.

The cloud storage 30 is configured as, for example, a PC, a mainframe, a server, or the like and includes a processing apparatus 31 and a peripheral apparatus 32. The processing apparatus 31 includes a main storage unit (a main memory) 33 and a CPU 34 which is an example of a processor.

The CPU 34 performs various kinds of processing in accordance with programs stored in the main storage unit 33.

The main storage unit 33 is, for example, a RAM and stores necessary information and programs executed by the CPU 34. The main storage unit 33 includes an object system management program 331, an object operation program 332, a file operation program 333, a file dividing/coupling program 334, a decode/encode program 335, and a data communication file transfer program 338.

The object system management program 331 manages an object system that manages objects. The object operation program 332 performs operations (write, read, delete, and the like) on the objects. The file operation program 333 performs operations (write, read, delete, and the like) on files included in the objects. The file dividing/coupling program 334 divides a file into chunks or integrates chunks. The decode/encode program 335 includes an expansion/compression program 336 and a decryption/encryption program 337. The expansion/compression program 336 performs expansion processing and compression processing on data. The decryption/encryption program 337 performs decode (decrypting) processing for encrypted data and encrypting processing for data. The data communication file transfer program 338 performs data communication or file transferring processing via the network 50.

The peripheral apparatus 32 includes an auxiliary storage unit 35 and a NIC 36. The main storage unit 33, the CPU 34, the auxiliary storage unit 35, and the NIC 36 are coupled via a bus 37.

The auxiliary storage unit 35 is, for example, a nonvolatile storage device such as an HDD, a flash memory, or a block storage and stores programs executed by the CPU 34, various kinds of data used in the CPU 34, or information (also including an object) that configures an object system 351.

The object system 351 stores a bucket 352. The bucket 352 stores one or more objects 353. The object 353 includes a user data file 354 and a metadata file 355. The user data file 354 is a file managed by the file storage 20 or a file of the chunks of the file. The metadata file 355 is metadata in the object system 351 with regard to the user data file 354.

Figure 4:
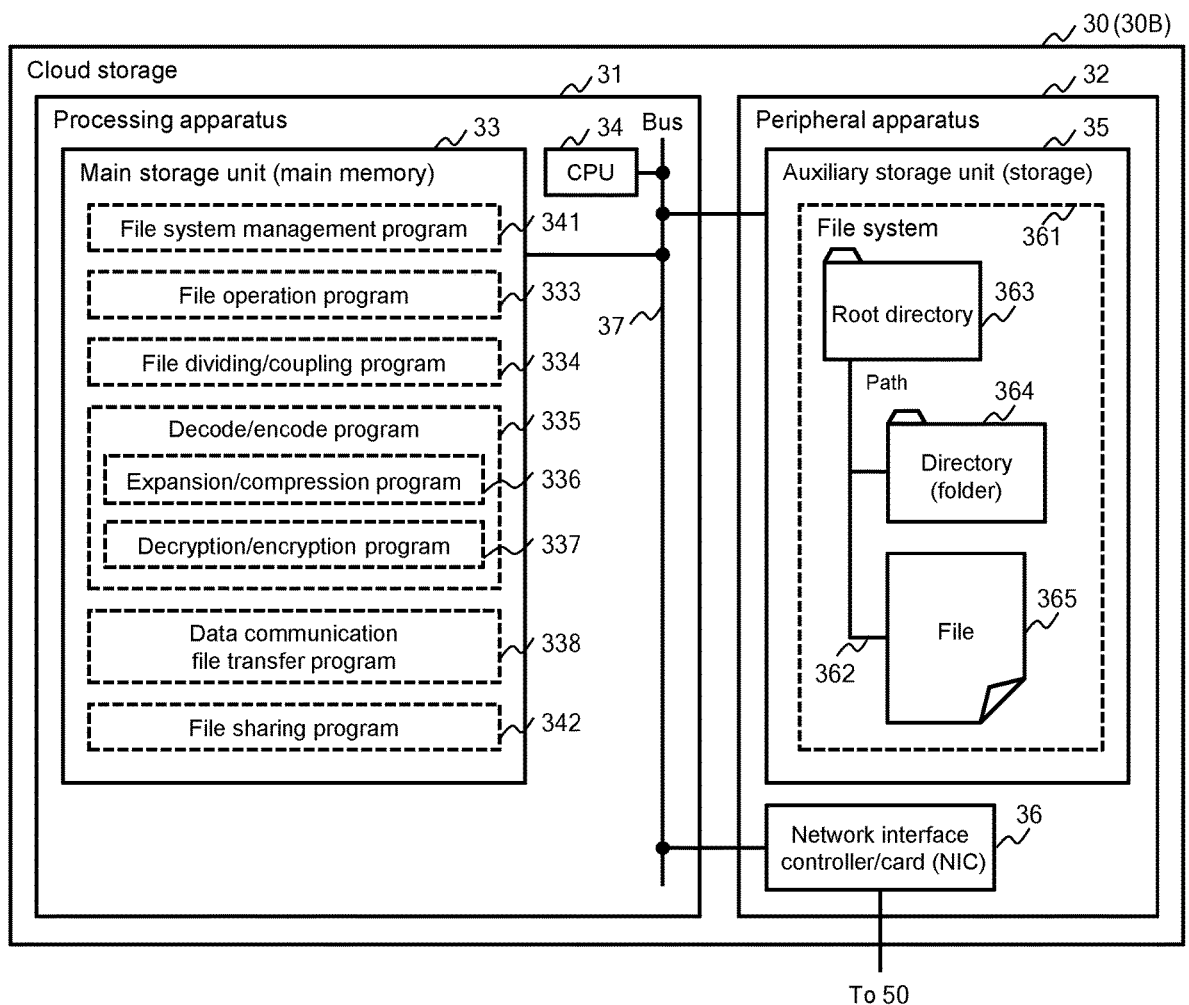
FIG. 4 is a diagram illustrating a second configuration of the cloud storage according to the embodiment.

FIG. 4 is a diagram illustrating a second configuration of the cloud storage according to the embodiment. The cloud storage 30 illustrated in FIG. 4 is configured as a file storage that manages data as a file. Similar symbols are given to portions similar to those of the configuration illustrated in FIG. 3 and repeated description will be omitted in some cases.

The main storage unit 33 includes a file system management program 341, a file operation program 333, a file dividing/coupling program 334, a decode/encode program 335, a data communication file transfer program 338, and a file sharing program 342. The decode/encode program 335 includes a expansion/compression program 336 and a decryption/encryption program 337.

The file system management program 341 manages a file system that manages files. The file sharing program 342 performs processing related to file sharing between the file storages 20 at a plurality of bases.

Next, the chunk map 258A for chunk individual storage will be described.

FIG. 5 is a diagram illustrating a configuration of a chunk map for chunk individual storage according to the embodiment.

The chunk map 258A for chunk individual storage is a chunk map for chunks in the cloud storage 30 stored individually as files (objects when the cloud storage 30 is an object storage). The chunk map 258A is provided to correspond to each file in the file storage 20. The chunk map 258A has an entry for each chunk of a file corresponding to the chunk map 258A. The entry of the chunk map 258A includes fields of a start unprocessed file offset 2581, an end unprocessed file offset (an unprocessed chunk size) 2582, a chunk file identifier 2583, a chunk file size 2584, an encoding scheme 2585, and a chunk hash value 2586. The end unprocessed file offset (an unprocessed chunk size) 2582, the chunk file size 2584, and the chunk hash value 2586 are not essential fields in terms of an operation.

In the start unprocessed file offset 2581, a start position (a start unprocessed file offset) of a chunk from the top of an unprocessed file of the chunk corresponding to the entry is stored. Here, the unprocessed state is a state in which encoding such as compression or encryption has not been performed and an unprocessed file is a file which has not been processed, that is, an uncompressed plaintext file. In the end unprocessed file offset (an unprocessed chunk size) 2582, an end position (an end unprocessed file offset) from the top of an unprocessed file of the chunk corresponding to the entry is stored and a size of the unprocessed chunk (a chunk size) is stored. In the end unprocessed file offset (an unprocessed chunk size) 2582, only one of the end offset or the chunk size may be stored. In the chunk file identifier 2583, an identifier with which the chunk corresponding to the entry is identified in the cloud storage 30 (in this example, a file identifier) is stored. In the chunk file size 2584, a file size of the chunk stored in the cloud storage 30, that is, a chunk size of the chunk after predetermined processing corresponding to the chunk, is stored. In the encoding scheme 2585, a scheme for the encoding processing performed on the chunk corresponding to the entry is stored. The scheme is content of encoding processing (compression processing and/or encryption processing, or the like) or the unprocessed state and is, for example, a name indicating compression processing when the compressing processing is performed, a name indicating encryption processing when the encryption processing is performed, and "unprocessed" when no processing is performed. In the chunk hash value 2586, a hash value of the chunk corresponding to the entry is stored.

Next, the chunk map 258B for chunk coupled storage will be described.

FIG. 6 is a diagram illustrating a configuration of a chunk map for chunk coupled storage according to the embodiment.

The chunk map 258B for chunk coupled storage is a chunk map for the chunks that are coupled in the cloud storage 30 and stored as one file (an object when the cloud storage 30 is an object storage). The chunk map 258B is provided to correspond to each file in the file storage 20. The chunk map 258B has an entry for each chunk of a file corresponding to the chunk map 258B. The entry of the chunk map 258B includes fields of a start unprocessed file offset 2581, an end unprocessed file offset (an unprocessed chunk size) 2582, a start encoding file offset 2591, an end encoding file offset (an encoded chunk size) 2592, an encoding scheme 2585, and a chunk hash value 2586. Similar symbols are given to fields similar to those of the chunk map 258A and repeated description will be omitted. The end unprocessed file offset (an unprocessed chunk size) 2582, the end encoding file offset (an encoded chunk size) 2592, and the chunk hash value 2586 are not essential fields in terms of an operation.

In the start encoding file offset 2591, a start position (a start encoded file offset) of a chunk from the top of a file after the encode processing of the chunk corresponding to the entry, that is, in a coupled state after encoding such as compression or encryption, is stored. In the end encoding file offset (an encoded chunk size) 2592, an end position (an end encoded file offset) from the top of a file after the encode processing for the chunk corresponding to the entry is stored and a size of the chunk after the encode processing (an encoded chunk size) is stored. In the end encoding file offset (an encoded chunk size) 2592, only one of the end encoded file offset and the encoded chunk size may be stored.

Next, the chunk map 256 will be described.

FIG. 7 is a diagram illustrating a configuration of a chunk map according to the embodiment.

The chunk map 256 manages an identifier of a file (a chunk map file) of the chunk map 256 corresponding to a file (a user file) used by a user. The chunk map 256 stores an entry for each user file. A file which is a target of the chunk map 256 is a file (a handled file) which is a target of a method (the present method) to be used by configuring a processing for the chunks when storing the chunk. The entry of the chunk map 256 includes a handled file identifier 2561, a chunk map file identifier 2562, and a storage state 2563.

In the handled file identifier 2561, a file identifier in the cloud storage 30 of the handled file corresponding to the entry is stored. In the chunk map file identifier 2562, a file identifier of a file of the chunk map 258 of the file corresponding to the entry is stored. In the storage state 2563, a storage state of the file corresponding to the entry in the cloud storage 30 is stored. The storage state is, for example, divided when the chunks are individually stored and coupled when the chunks are coupled and stored.

The chunk map 256 is not essential in terms of an operation. For example, by naming the identifier of the chunk map file, for example, "file path/map", a file identifier of the chunk map can be specified from the file path. In this case, a storage state (divided/coupled) of the file in the cloud storage 30 may be determined from a table format or the like of the chunk map. When the chunk map cannot be accessed with the file identifier of the chunk map specified from the file path, known read/write may be performed. In the embodiment, a file which is a target of the chunk map 256 is a file which is a target of the method (the present method) to be used by configuring a processing for the chunk when storing the chunk, but the present invention is not limited thereto. A file other than the file which is the target of the present method may also be a target. In a file other than the file which is the target of the present method, a value may not be configured in the chunk map file identifier 2562 of the corresponding entry.

Next, a processing operation in the computer system 1 according to the embodiment will be described.

First, file initial storage processing when a file (an object when the cloud storage 30 is an object storage) is compressed and managed in units of files (objects) in the cloud storage 30 (a first scheme) will be described.

Figure 8:
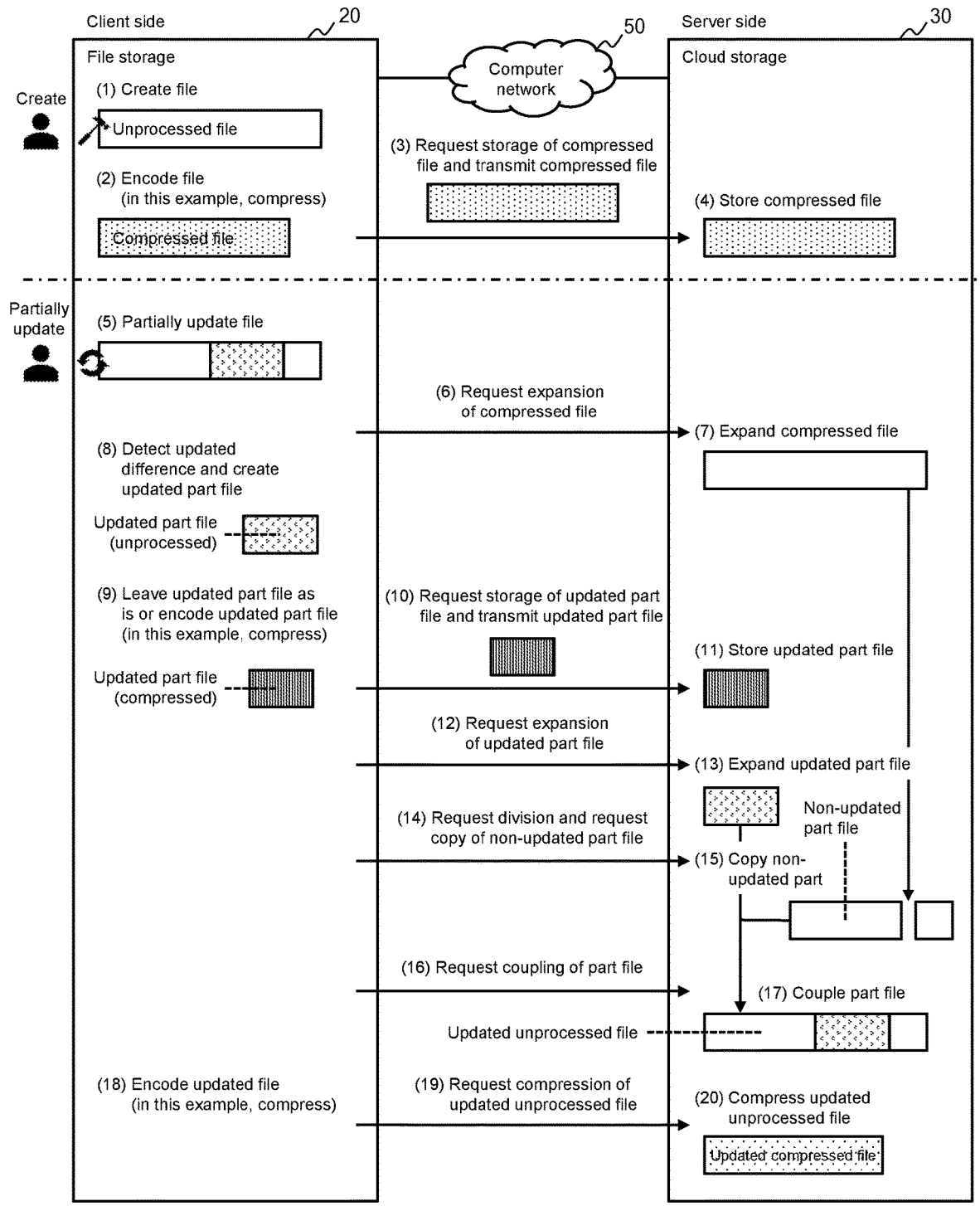
FIG. 8 is a sequence diagram illustrating file initial storage processing and actual file partial update processing in a first scheme according to the embodiment.

FIG. 8 is a sequence diagram illustrating file initial storage processing and actual file partial update processing in the first scheme according to the embodiment.

In the file storage 20, for example, the CPU 24 creates a file in accordance with a file creation instruction by a user from the computer 10. The file creates here is an unprocessed file on which the encode processing (compression processing, encryption processing, or the like) has not been performed (FIG. 8 (1)). An instruction to create the file includes an instruction based on processing in the file storage 20 in addition to the instruction by the user from the computer 10.

Subsequently, the CPU 24 performs processing corresponding to the processing content configured for the unprocessed file (FIG. 8 (2)). Here, the processing content for the file may be processing content configured in advance for a file or may be processing content configured in accordance with a user's instruction. As the processing content, there is encode processing (compression processing, encryption processing, or the like). In the example of FIG. 8 (2), a file subjected to the compression processing will be described as a compressed file on the assumption that the compression processing is performed on the file. When the processing content is the unprocessed state, nothing is performed. Here, the file subjected to the encode processing corresponds to an encoded file.

Subsequently, the CPU 24 transmits a request for storing the compressed file in the cloud storage 30 and transmits the compressed file (FIG. 8 (3)).

In the cloud storage 30, the CPU 34 stores the compressed file transmitted from the file storage 20 in the auxiliary storage unit 35 (FIG. 8 (4)). Here, in the case that the cloud storage 30 is an object storage, the compressed file is stored as an object. On the other hand, in the case that the cloud storage 30 is file storage, the compressed file is stored as a file.

Next, an actual file partial update processing of updating a part of a file when a substance of a file (an actual file) is stored in the file storage 20 in the first scheme will be described.

The actual file partial update processing is processing performed when a request for updating the actual file is received from the computer 10.

When a partial update request by the user for the file is received from the computer 10, the CPU 24 updates a part which is a target of the partial update request for the file (FIG. 8 (5)). Data of the updated part in the file is referred to as an update difference.

Subsequently, the CPU 24 transmits a request for expanding a compressed file corresponding to an updating target file (an expand request) to the cloud storage 30 (FIG. 8 (6)).

In the cloud storage 30, the CPU 34 performs expansion processing of expanding the compressed file requested from the file storage 20 (FIG. 8 (7)). Through this processing, an unprocessed file of the updating target file is generated.

Subsequently, the CPU 24 detects the update difference and creates a file of a part of the update difference (an updated part) (an updated part file) (FIG. 8 (8)). Here, the updated part file is in an unprocessed state.

Subsequently, the CPU 24 performs processing corresponding to the processing content configured for the generated updated part file on the created updated part file (FIG. 8 (9)). Here, in this example, since compression is configured for the file, the CPU 24 performs compression processing on each chunk file of the file. Here, the updated part file becomes a compressed state.

Subsequently, the CPU 24 transmits a request for storing the compressed updated part file and transmits the updated part file to the cloud storage 30 (FIG. 8 (10)).

In the cloud storage 30, the CPU 34 stores the updated part file requested from the file storage 20 in the auxiliary storage unit 35 (FIG. 8 (11)).

Subsequently, the CPU 24 transmits an expand request for expanding the updated part file to the cloud storage 30 (FIG. (12)).

In the cloud storage 30, the CPU 34 expands the updated part file corresponding to the expand request (FIG. 8 (13)).

Subsequently, the CPU 24 transmits a divide request for dividing the unprocessed file into parts which are not updated (non-updated parts) and a copy request for copying the non-updated parts to the cloud storage 30 (FIG. 8 (14)). Here, the divide request includes positional information with which a position of updated parts in the unprocessed file can be specified.

In the cloud storage 30, the CPU 34 divides the non-updated parts, excluding the updated parts, from the unprocessed file based on the positional information of the updated parts included in the divide request, copies the non-updated parts, and stores the non-updated parts in the auxiliary storage unit 35 (FIG. 8 (15)).

Subsequently, the CPU 24 transmits a request for coupling the non-updated parts and the updated parts (a part file coupling request) to the cloud storage 30 (FIG. 8 (16)).

In the cloud storage 30, the CPU 34 creates an updated unprocessed file by coupling the non-updated parts and the updated parts based on the part file coupling request (FIG. 8 (17)).

Subsequently, the CPU 24 specifies the processing content configured for the updated unprocessed file (in this example, compression processing) (FIG. 8 (18)).

Subsequently, the CPU 24 transmits a request for executing the specified processing for the updated unprocessed file, in this example, a request for compressing the updated unprocessed file (an updated unprocessed file compression request), to the cloud storage 30 (FIG. 8 (19)).

In the cloud storage 30, the CPU 34 compresses the updated unprocessed file to produce an updated compressed file based on the updated unprocessed file compression request and stores the updated compressed file in the auxiliary storage unit 35 (FIG. 8 (20)).

As described above, through the actual file partial update processing of the first scheme according to the embodiment, the compressed updated part file is transmitted. Therefore, it is possible to reduce an amount of data transferred between the file storage 20 and the cloud storage 30. In the file storage 20, before the updated parts are compressed and the updated part file in the compressed state is transmitted, the compressed file expansion request is transmitted to the cloud storage 30. Therefore, the processing in which a relatively long time is necessary on the side of the cloud storage 30 can be started early. As a result, it is possible to reduce a time until the update processing is completed.

Next, when processing of reading a part of a file in a case in which the stub file is stored in the file storage 20 in the first scheme, that is, an actual file is not stored or reading target data is not stored (partial read processing), will be described.

Figure 9:
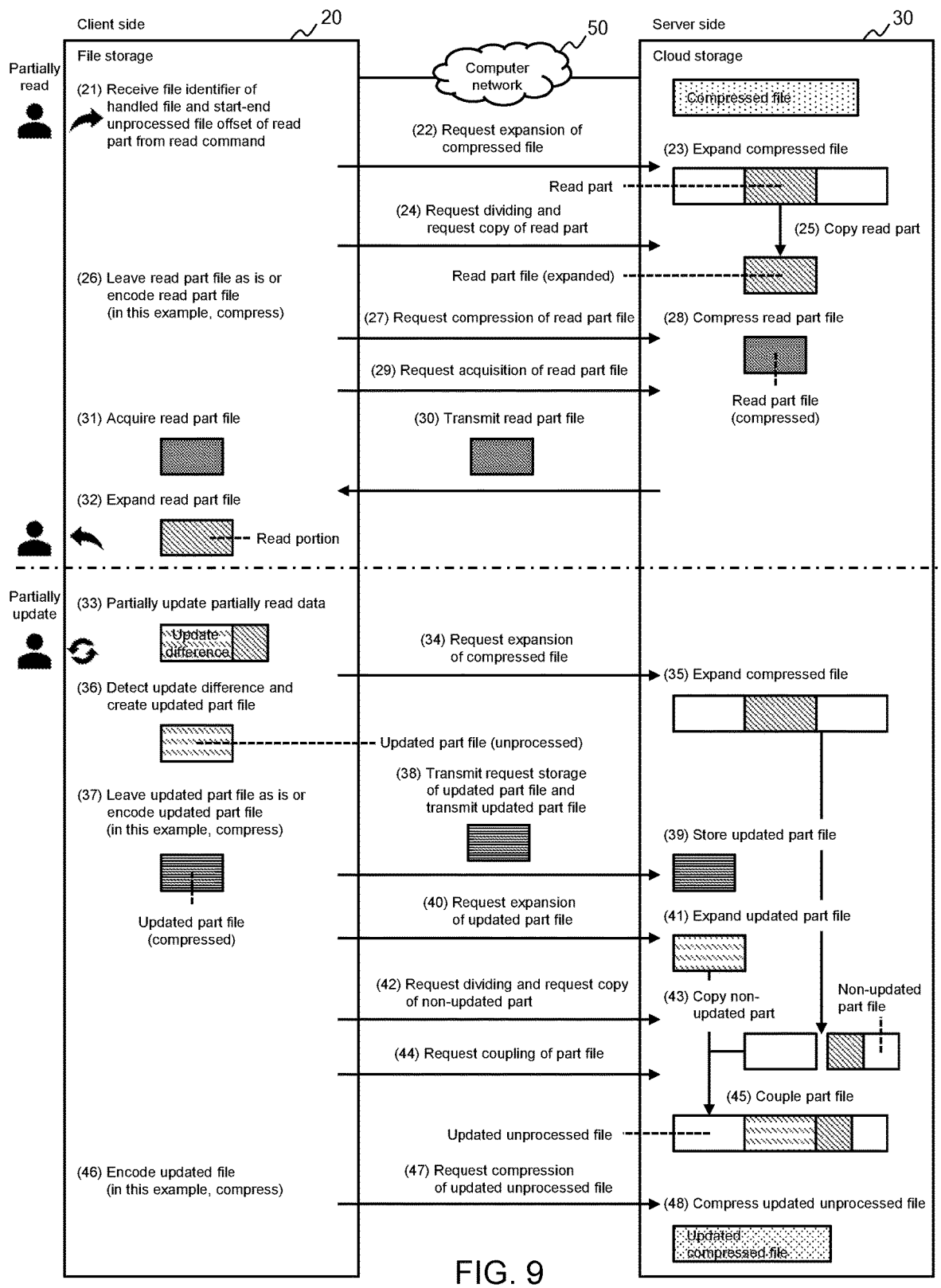
FIG. 9 is a sequence diagram illustrating file partial read processing and file partial update processing in the first scheme according to the embodiment.

FIG. 9 is a sequence diagram illustrating file partial read processing and file partial update processing in the first scheme according to the embodiment.

The file partial read processing is performed, for example, when the file storage 20 receives a read command to read data of a part of the file as a read target from the computer 10 and there is no data of the part of the read target in the file storage 20. Here, the read command includes a file identifier of the read target file (a handled file) and an offset of a part which is a read target (a read part: read target part) in the handled file in the unprocessed state. The read command includes a command based on processing in the file storage 20 as well as a command based on an instruction by the user from the computer 10.

The CPU 24 of the file storage 20 receives the file identifier of the handled file and a start-end unprocessed file offset of the read part (a start unprocessed file offset and an end unprocessed file offset) from the read command (FIG. 9 (21)).

Subsequently, the CPU 24 transmits a file expansion request for the read target file (a compressed file expansion request) to the cloud storage 30 (FIG. 9 (22)). Here, the file expansion request includes the file identifier of the read target file.

In the cloud storage 30, the CPU 34 expands the compressed file corresponding to the compressed file expansion request (FIG. 9 (23)).

Subsequently, the CPU 24 transmits a divide request for dividing the read part from the unprocessed file and the copy request to copy the read part to the cloud storage 30 (FIG. 9 (24)). Here, the divide request includes positional information with which a position of the read part in the unprocessed file can be specified (a start-end unprocessed file offset).

In the cloud storage 30, the CPU 34 divides the read part from the unprocessed file based on the positional information of the read part included in the divide request, copies the read part, and stores the read part as a file (a read part file) in the auxiliary storage unit 35 (FIG. 9 (25)).

Subsequently, the CPU 24 specifies the processing content (in this example, the compression processing) in the read part file (FIG. 9 (26)) and transmits a request for compressing the read part file (a read part file compression request) to the cloud storage 30 (FIG. 9 (27)).

In the cloud storage 30, the CPU 34 compresses the read part file corresponding to the read part file compression request to achieve a compressed state (FIG. 9 (28)).

Subsequently, the CPU 24 transmits a request for acquiring the read part file (a read part file acquisition request) to the cloud storage 30 (FIG. 9 (29)).

In the cloud storage 30, the CPU 34 transmits the read part file in the compressed state to the file storage 20 (FIG. 9 (30)).

Subsequently, the CPU 24 acquires the read part file (FIG. 9 (31)), expands the acquired read part file (FIG. 9 (32)), and transmits data of the read part file to a command source of the read command (for example, the computer 10).

As described above, through the file partial update processing of the first scheme according to the embodiment, because the read part file in the compressed state is transmitted, it is possible to reduce an amount of data transmitted between the file storage 20 and the cloud storage 30.

Next, file partial update processing of updating a part of a read part read to the file storage 20 in the first scheme will be described.

The file partial update processing is processing performed when an update request for the read part is received from the computer 10.

When a partial update request for the read part by the user is received from the computer 10, the CPU 24 updates a target part of the partial update request for the read part (FIG. 9 (33)). Data of the updated part in the read part is referred to as an update difference.

Subsequently, the CPU 24 transmits a request for expanding a compressed file corresponding to an update target file (an expand request) to the cloud storage 30 (FIG. 9 (34)).

In the cloud storage 30, the CPU 34 performs expansion processing of expanding the compressed file requested from the file storage 20 (FIG. 9 (35)). Through this processing, an unprocessed file of the updating target file is created.

Subsequently, the CPU 24 detects the update difference and creates a file of a part of the update difference (an updated part) (an updated part file) (FIG. 9 (36)). Here, the updated part file is in an unprocessed state.

Subsequently, the CPU 24 performs processing corresponding to the processing content configured for the created updated part file (FIG. 9 (37)). Here, in this example, since compression is configured for the file, the CPU 24 performs compression processing on the updated part file. Here, the updated part file becomes in a compressed state.

Subsequently, the CPU 24 transmits a request for storing the compressed updated part file and transmits the updated part file to the cloud storage 30 (FIG. 9 (38)).

In the cloud storage 30, the CPU 34 stores the updated part file requested from the file storage 20 in the auxiliary storage unit 35 (FIG. 9 (39)).

Subsequently, the CPU 24 transmits an expand request for expanding the updated part file to the cloud storage 30 (FIG. 9 (40)).

In the cloud storage 30, the CPU 34 expands the updated part file corresponding to the expand request (FIG. 9 (41)).

Subsequently, the CPU 24 transmits a divide request for dividing the unprocessed file into parts which are not updated (non-updated parts) and a copy request for copying the non-updated parts to the cloud storage 30 (FIG. 9 (42)). Here, the divide request includes positional information with which position of updated parts in the unprocessed file can be specified.

In the cloud storage 30, the CPU 34 divides the file into the non-updated parts excluding the updated parts from the unprocessed file based on the positional information of the updated parts included in the divide request, and copies and stores the non-updated parts in the auxiliary storage unit 35 (FIG. 9 (43)).

Subsequently, the CPU 24 transmits a request for integrating the non-updated parts and the updated parts (a part file couple request) to the cloud storage 30 (FIG. 9 (44)).

In the cloud storage 30, the CPU 34 creates an unprocessed file after updated by coupling the non-updated parts and the updated parts (an updated unprocessed file) based on the part file couple request (FIG. 9 (45)).

Subsequently, the CPU 24 specifies the processing content configured for the unprocessed file after the updating (in this example, compression processing) (FIG. 9 (46)).

Subsequently, the CPU 24 transmits a request for executing the processing of specified for the unprocessed file, in this example, a request for compressing the updated unprocessed file (an updated unprocessed file compression request) to the cloud storage 30 (FIG. 9 (47)).

In the cloud storage 30, the CPU 34 compresses the updated unprocessed file to produce an updated compressed file based on the updated unprocessed file compression request and stores the updated compressed file in the auxiliary storage unit 35 (FIG. 9 (48)).

As described above, through the file partial update processing of the first scheme according to the embodiment, the compressed updated part file is transmitted. Therefore, it is possible to reduce an amount of data transferred between the file storage 20 and the cloud storage 30. In the file storage 20, before the updated parts are compressed and the updated part file in the compressed state is transmitted, the compressed file expansion request is transmitted to the cloud storage 30. Therefore, the processing in which a relatively long time is necessary on the side of the cloud storage 30 can be started early. As a result, it is possible to reduce a time in which the update processing is completed.

Next, file initial storage processing when a file (an object when the cloud storage 30 is an object storage) is compressed and managed in predetermined chunk units in the cloud storage 30 (a second scheme) and when the chunks are to be coupled and stored in the cloud storage 30 (when the chunk coupled storage is configured) will be described.

Figure 10:
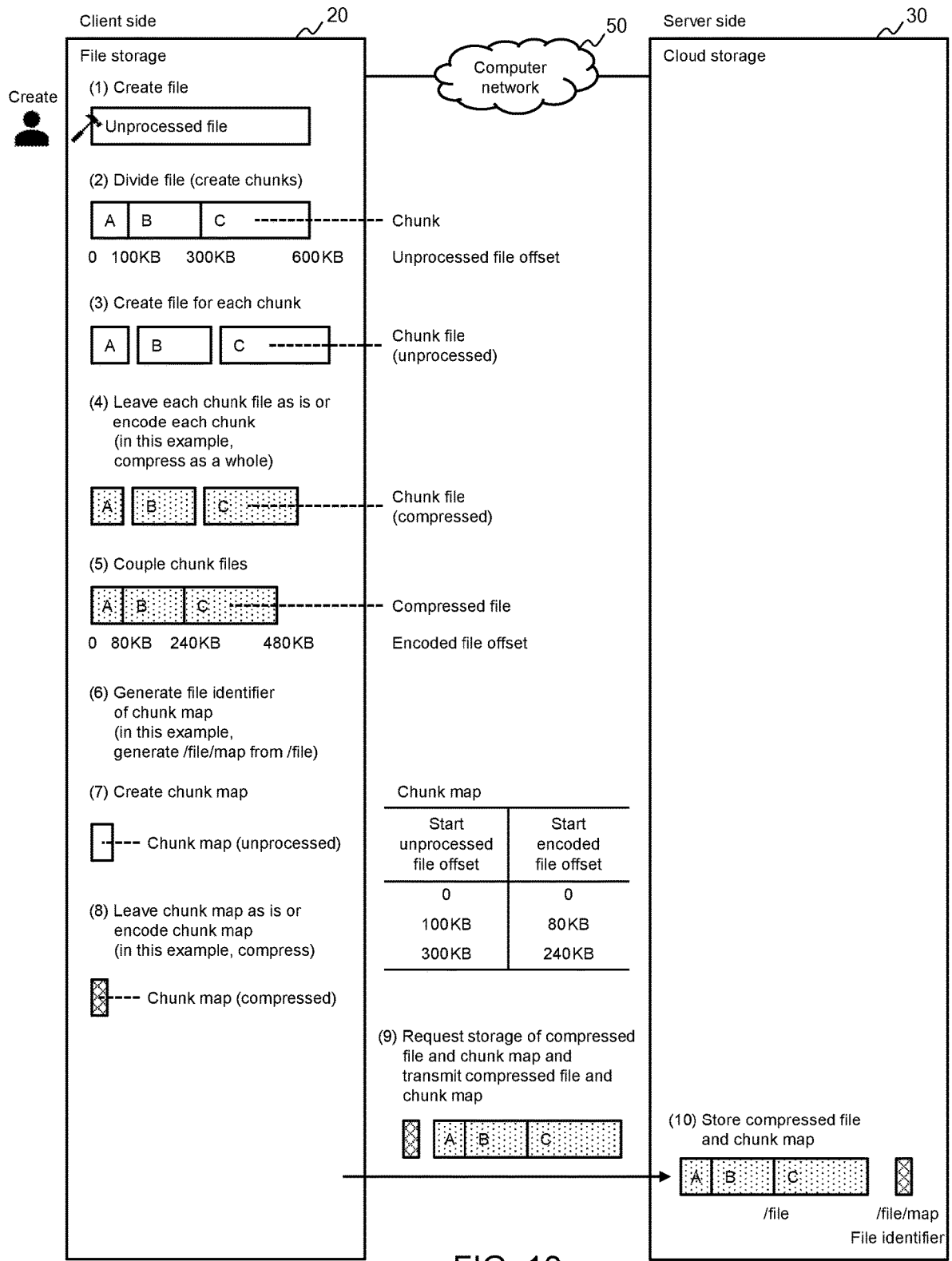
FIG. 10 is a sequence diagram illustrating file initial storage processing when a chunk coupled storage is configured in a second scheme according to the embodiment.

FIG. 10 is a sequence diagram illustrating file initial storage processing when a chunk coupled storage is configured in the second scheme according to the embodiment.

In the file storage 20, for example, the CPU 24 creates a file in accordance with an instruction by the user from the computer 10. The file created herein is an unprocessed file on which the compression processing or the encrypt processing is not performed (FIG. 10 (1)). An instruction to create the file includes an instruction based on processing in the file storage 20 in addition to the instruction by the user from the computer 10.

Subsequently, the CPU 24 performs processing of dividing the created unprocessed file into a plurality of chunks (FIG. 10 (2)). Here, the chunk may have a size within a pre-decided range, may have a constant size, or may have any size. In this example, the file is divided into a chunk A with an offset range of 0 to 100 KB, a chunk B with an offset range of 100 KB to 300 KB, and a chunk C with an offset range of 300 KB to 600 KB.

Subsequently, the CPU 24 creates each chunk as a file (a chunk file) (FIG. 10 (3)). The chunk file in this state is referred to as an unprocessed chunk file.

Subsequently, the CPU 24 performs processing corresponding to the processing content configured for the chunk for each chunk (FIG. 10 (4)). Here, the processing content for the chunk may be identical processing content configured in advance as a whole or may be processing content configured for each chunk in accordance with a instruction by the user. In this example, compression processing is assumed to be performed on all the chunks in description.

Subsequently, the CPU 24 couples the chunk files subjected to the processing corresponding to the configured processing content to produce one file (a compressed file) (FIG. 10 (5)). Here, in this example, after the processing, the size of each chunk is changed. The offset range of the chunk A after the processing is 0 to 80 KB, the offset range of the chunk B is 80 KB to 240 KB, and the offset range of the chunk C is 240 KB to 480 KB.

Subsequently, the CPU 24 generates a file identifier of the chunk map 258B from the file identifier received from the computer 10 as a file name of the file to be created (FIG. 10 (6)). In this example, the CPU 24 generates "/file/map" as a file identifier of the chunk map 258B based on a file identifier "/file".

Subsequently, the CPU 24 creates a file of the chunk map 258B (FIG. 10 (7)). The file of the chunk map 258B is a file on which encode processing has not been performed.

Subsequently, the CPU 24 determines whether to leave the chunk map 258B as-is or to perform encoding (compressing or encrypting) and perform the determined processing (FIG. 10 (8)). Whether to leave the chunk map 258B as-is or to perform encoding may be determined by default configuration or may be determined to be configured or designated by the user, or a determination to perform compression may be made when the chunk map 258B has a predetermined size or more. In this example, it is assumed that a determination to compress the chunk map 258B has been made and the chunk map 258B is compressed.

Subsequently, the CPU 24 transmits a request for storing the compressed file and the chunk map and transmits data of the compressed file and the chunk map to the cloud storage 30 (FIG. 10 (9)).

In this example, the chunk map 258B includes an entry of the chunk A that has a start unprocessed file offset of 0 bytes and a start encoded file offset of 0 KB, an entry of the chunk B that has a start unprocessed file offset of 100 KB and a start encoded file offset of 80 KB, and an entry of the chunk C that has a start unprocessed file offset of 300 KB and a start encoded file offset of 240 KB.

In the cloud storage 30, the CPU 34 separately stores the compressed file and the chunk map transmitted from the file storage 20 in the auxiliary storage unit 35 (FIG. 10 (10)). Here, when the cloud storage 30 is an object storage, the compressed file and the chunk map are each stored as separate objects. When the cloud storage 30 is a file storage, the compressed file and the chunk map are each stored as files. In the cloud storage 30, the chunk file and the chunk map are stored without being encoded.

Next, processing of partially updating a file when the chunk coupled storage is configured of the second scheme (partial update processing) will be described.

Figure 11:
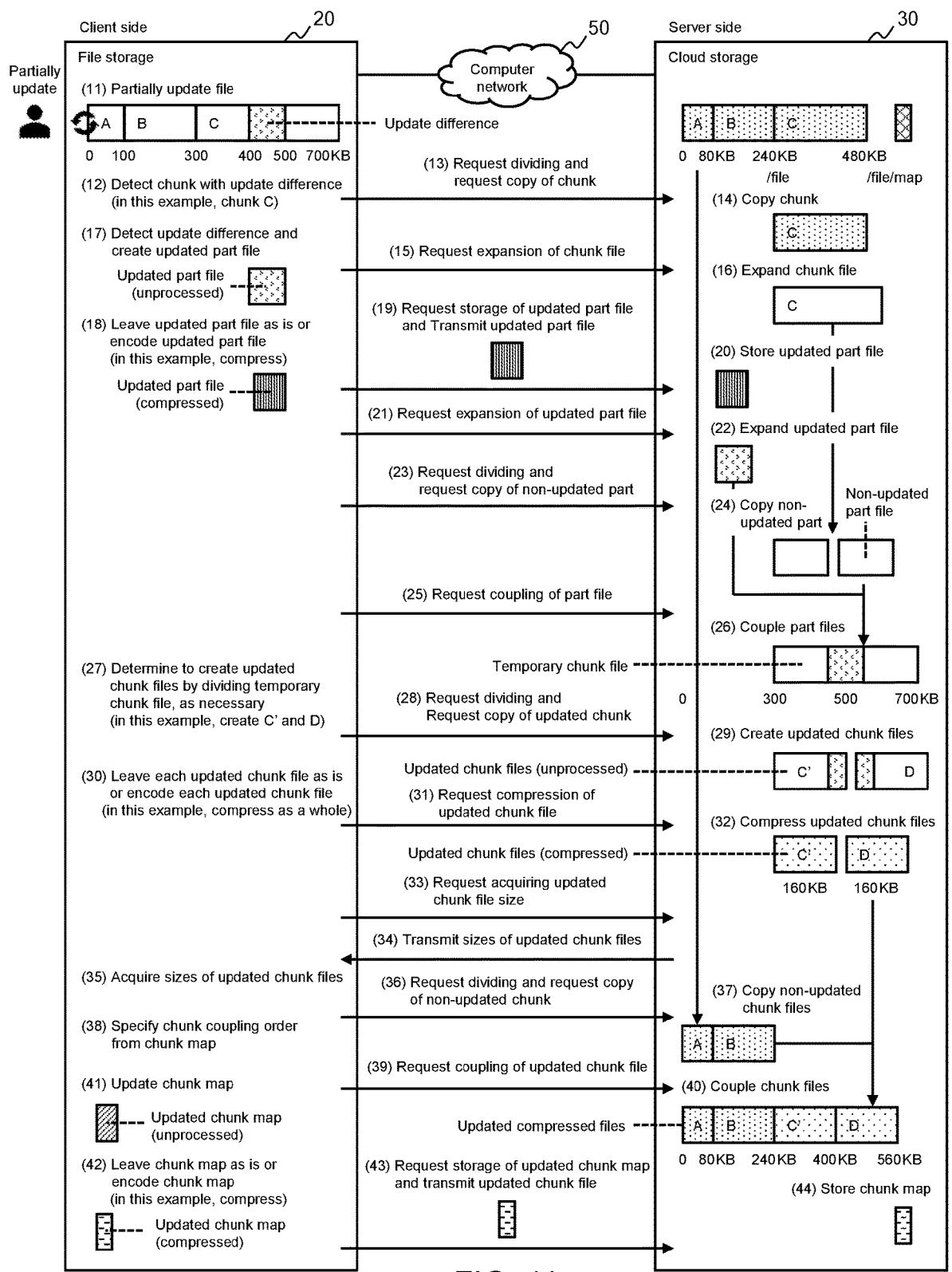
FIG. 11 is a sequence diagram illustrating actual file partial update processing in the chunk coupled storage configuration in the second scheme according to the embodiment.

FIG. 11 is a sequence diagram illustrating actual file partial update processing when the chunk coupled storage is configured in the second scheme according to the embodiment.

The actual file partial update processing is processing performed when a request for updating the actual file is received from the computer 10.

When the CPU 24 receives the partial update request for the file by the user from the computer 10, the CPU 24 updates a part which is a target of the partial update request for the file (FIG. 11 (11)). Data of a part updated in the file is referred to as an update difference.

Subsequently, the CPU 24 detects a chunk with the update difference (an updated chunk) (FIG. 11 (12)). In this example, the chunk C is detected as an updated chunk.

Subsequently, the CPU 24 transmits a divide request for dividing the chunk corresponding to the updated chunk (a target chunk) in the compressed file and a copy request for copying the target chunk to the cloud storage 30 (FIG. 11 (13)). Here, the divide request includes information with which the target chunk in the compressed file can be specified.

In the cloud storage 30, the CPU 34 divides the target chunk of the compressed file and copies and stores the target chunk in the auxiliary storage unit 35 (FIG. 11 (14)).

Subsequently, the CPU 24 transmits a request for expanding the target chunk (a chunk file expand request) to the cloud storage 30 (FIG. 11 (15)).

In the cloud storage 30, the CPU 34 performs expansion processing of expanding the target chunk requested from the file storage 20 (FIG. 11 (16)). Through this processing, a file of the target chunk (a target chunk file) is created.

Subsequently, the CPU 24 detects the update difference and creates a file of the part with the update difference (an updated part) (an updated part file) (FIG. 11 (17)). Here, the updated part file is in an unprocessed state.

Subsequently, the CPU 24 performs processing corresponding to the processing content configured for the generated updated part file (FIG. 11 (18)). Here, in this example, since compression is configured for the file, the CPU 24 performs compression processing on the updated part file. Here, the updated part file becomes in a compressed state.

Subsequently, the CPU 24 transmits a request for storing the compressed updated part file and transmits the updated part file to the cloud storage 30 (FIG. 11 (19)).

In the cloud storage 30, the CPU 34 stores the updated part file requested from the file storage 20 in the auxiliary storage unit 35 (FIG. 11 (20)).

Subsequently, the CPU 24 transmits an expand request for expanding the updated part file to the cloud storage 30 (FIG. 11 (21)).

In the cloud storage 30, the CPU 34 expands the updated part file corresponding to the expand request (FIG. 11 (22)).

Subsequently, the CPU 24 transmits a divide request for dividing the target chunk file into parts which are not updated (non-updated parts) and a copy request for copying the non-updated parts to the cloud storage 30 (FIG. 11 (23)). Here, the divide request includes positional information with which position of updated parts in the target chunk file can be specified.

In the cloud storage 30, the CPU 34 divides the non-updated parts from the target chunk file based on the positional information included in the divide request, and copies and stores the non-updated parts in the auxiliary storage unit 35 (FIG. 11 (24)).

Subsequently, the CPU 24 transmits a request for coupling the non-updated parts and the updated parts (a part file couple request) to the cloud storage 30 (FIG. 11 (25)).

In the cloud storage 30, the CPU 34 creates temporary chunk files after updated by coupling the non-updated parts and the updated parts (a temporary chunk file) based on the part file couple request (FIG. 11 (26)).

Subsequently, the CPU 24 determines whether to divide the temporary chunk file into a plurality of chunk files (updated chunk files) (FIG. 11 (27)). Here, when the temporary chunk file has a size within a predetermined range, it may be determined that the temporary chunk file is not divided. The divided chunk file may have a size within a pre-decided range or may have a constant size or any size. In this example, it is assumed that the temporary chunk file is determined to be divided into a chunk file C' and a chunk file D.

Subsequently, the CPU 24 transmits a divide request for dividing the temporary chunk file into the determined updated chunk files and a copy request for copying the divided updated chunks to the cloud storage 30 (FIG. 11 (28)).

In the cloud storage 30, the CPU 34 divides the temporary chunk file into the updated chunk files based on the divide request and copies and stores the updated chunk files in the auxiliary storage unit 35 (FIG. 11 (29)).

Subsequently, the CPU 24 specifies the processing content (in this example, compression processing) configured for the updated chunk files (FIG. 11 (30)).

Subsequently, the CPU 24 transmits a request for executing the specified processing for the updated chunk files, in this example, a request for compressing the updated chunk files (an updated chunk file compression request) to the cloud storage 30 (FIG. 11 (31)).

In the cloud storage 30, the CPU 34 compresses the updated chunk files based on the updated chunk file compression request and stores the compressed updated chunk files in the auxiliary storage unit 35 (FIG. 11 (32)).

Subsequently, the CPU 24 transmits a request for acquiring a size of the compressed updated chunk files (a size acquire request) to the cloud storage 30 (FIG. 11 (33)).

In the cloud storage 30, the CPU 34 transmits the size of each compressed updated chunk file in response to the size acquire request to the file storage 20 (FIG. 11 (34)).

Subsequently, the CPU 24 acquires the sizes of the compressed updated chunk files (FIG. 11 (35)).

Subsequently, the CPU 24 transmits a divide request for dividing the non-updated chunk file in the file in the compressed state and a copy request for copying the divided non-updated chunk files to the cloud storage 30 (FIG. 11 (36)).

In the cloud storage 30, the CPU 34 divides the non-updated chunk file with regard to the file based on the divide request and copies and stores the non-updated chunk files in the auxiliary storage unit 35 (FIG. 11 (37)).

Subsequently, the CPU 24 transmits a request for coupling the non-updated chunk files and the updated chunk files (an updated chunk file couple request) to the cloud storage 30 (FIG. 11 (39)).

In the cloud storage 30, the CPU 34 couples the non-updated chunk files and the updated chunk files to create the updated file based on the updated chunk file couple request and stores the updated file in the auxiliary storage unit 35 (FIG. 11 (40)).

Subsequently, the CPU 24 updates the chunk map 258B to accommodate new chunk content (FIG. 11 (41)).

Subsequently, the CPU 24 determines whether to leave the chunk map 258B as-is or to perform encoding (compressing or encrypting) and perform the determined processing (FIG. 11 (42)). Whether to leave the chunk map 258B as-is, or to perform encoding may be determined by default configuration or may be configured or designated by the user, or a determination to perform compression may be made when the chunk map 258B has a predetermined size or more. In this example, it is assumed that a determination to compress the chunk map 258B has been made and the chunk map 258B is compressed.

Subsequently, the CPU 24 transmits a request for storing the updated chunk map 258B and transmits data of the update chunk map 258B to the cloud storage 30 (FIG. 11 (43)).

In the cloud storage 30, the CPU 34 stores the chunk map transmitted from the file storage 20 in the auxiliary storage unit 35 (FIG. 11 (44)).

As described above, through the file partial update processing of the second scheme according to the embodiment, the compressed updated part file is transmitted. Therefore, it is possible to reduce an amount of data transferred between the file storage 20 and the cloud storage 30. In the cloud storage 30, the compression processing or the expansion processing is performed in units of chunks rather than units of files. Therefore, it is possible to reduce a processing load and reduce a processing time.

Next, processing of reading a part of a file (partial read processing) in the second scheme when a stub file is stored in the file storage 20, that is, an actual file is not stored or read target data is not stored, will be described.

Figure 12:
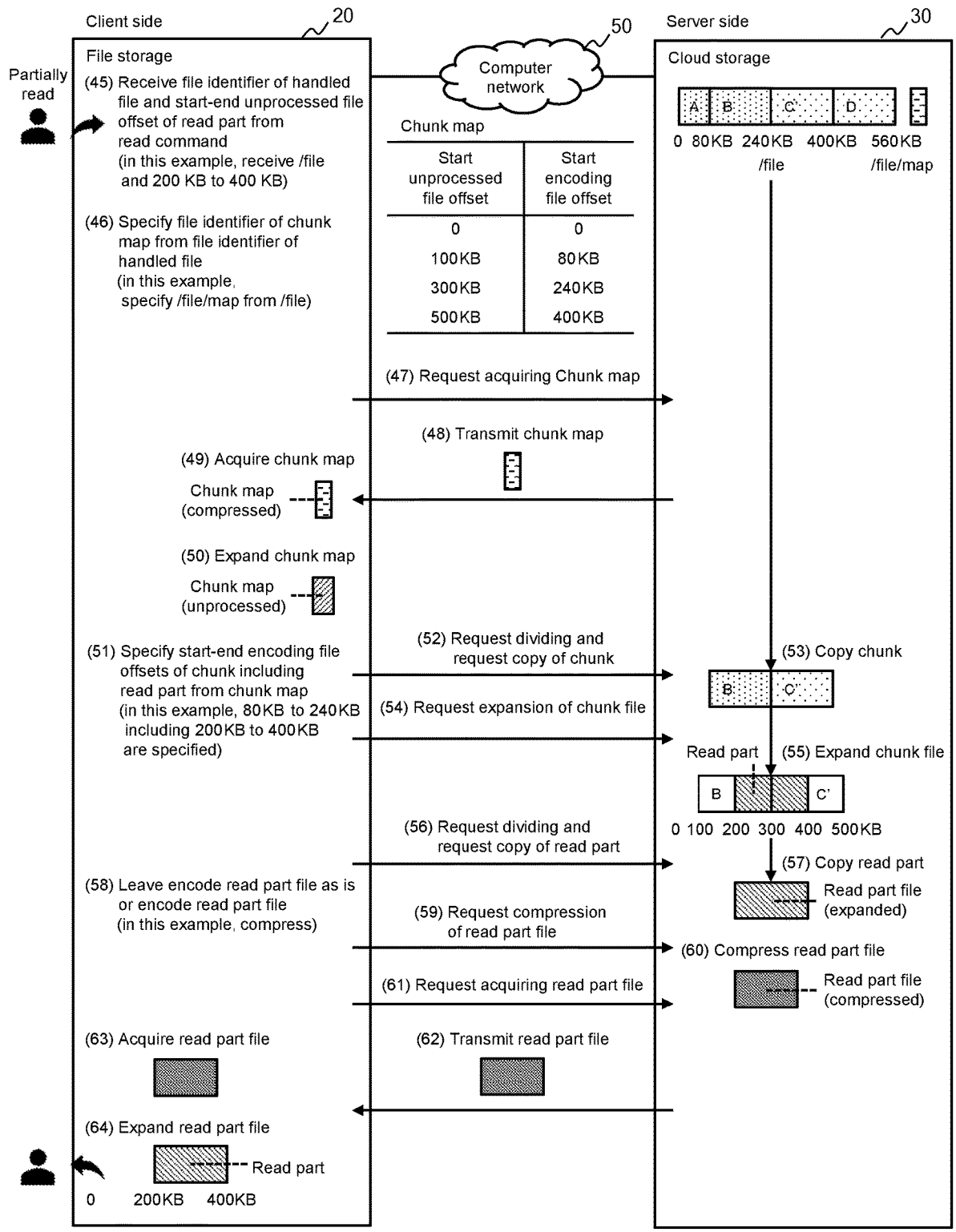
FIG. 12 is a sequence diagram illustrating partial read processing when the chunk coupled storage is configured in the second scheme according to the embodiment.

FIG. 12 is a sequence diagram illustrating partial read processing when the chunk coupled storage is configured in the second scheme according to the embodiment.

The partial read processing is performed, for example, when the file storage 20 receives a read command to read data of a part of the file as a read target from the computer 10 and there is not data of the part of the reading target in the file storage 20. Here, the read command includes a file identifier of the read target file (a handled file) and an offset of a part which is a read target (a read part) in the handled file in the unprocessed state. In this example, it is assumed that the file identifier is "/file" and the offset range is 200 KB to 400 KB in description. The read command includes a command based on processing in the file storage 20 as well as a command based on an instruction by user from the computer 10.

The CPU 24 of the file storage 20 receives the file identifier and the offset from the read command (FIG. 12 (45)).

Subsequently, the CPU 24 specifies the file identifier of the chunk map 258B from the file identifier of the read target file. In this example, the CPU 24 specifies the file identifier "/file/map" of the chunk map 258B from the file identifier "/file" (FIG. 12 (46)).

Subsequently, the CPU 24 transmits an acquire request for acquiring the chunk map with which the file identifier of the chunk map 258B is designated to the cloud storage 30 (FIG. 12 (47)).

The CPU 34 of the cloud storage 30 acquires the corresponding chunk map 258B from the auxiliary storage unit 35 in response to the acquire request for the chunk map 258B and transmits the chunk map 258B to the file storage 20 (FIG. 12 (48)).

The CPU 24 of the file storage 20 acquires the chunk map 258B transmitted from the cloud storage 30 (FIG. 12 (49)). Here, in this example, the acquired chunk map is the compressed chunk map 258B stored in FIG. 10 (10). The reason why the chunk map 258B is acquired from the cloud storage 30 is that the latest chunk map 258B is acquired when an identical file is shared with the other file storages 20.

Subsequently, the CPU 24 performs reverse encode processing (decode processing, in this example, expansion processing) on the chunk map 258B. Thus, the unprocessed chunk map 258B can be acquired (FIG. 12 (50)).

Subsequently, the CPU 24 specifies the start and end offsets (start-end encoded file offsets) after the encode processing on the chunk file from the offsets for the unprocessed file (the start-end unprocessed file offsets) of one or more chunk files including the read part with reference to the chunk map 258B (FIG. 12 (51)). In this example, 80 KB to 240 KB are specified as the start-end encoded file offsets of the chunk including 200 KB to 400 KB which are the start-end unprocessed file offsets of the read part.

Subsequently, the CPU 24 transmits a divide request for dividing the chunk including the read part (a read target chunk) in the unprocessed file and a copy request for copying the read target chunk to the cloud storage 30 (FIG. 12 (52)). Here, the divide request includes positional information with which a position of the read target chunk (the start-end unprocessed file offsets) in the unprocessed file can be specified.

In the cloud storage 30, the CPU 34 divides the read target chunk from the unprocessed file based on the positional information of the read target chunk included in the divide request, and copies and stores the read target chunk as a file (a read target chunk file) in the auxiliary storage unit 35 (FIG. 12 (53)).

Subsequently, the CPU 24 transmits a expand request for expanding the read target chunk file to the cloud storage 30 (FIG. 12 (54)).

In the cloud storage 30, the CPU 34 expands the read target chunk file corresponding to the expand request (FIG. 12 (55)).

Subsequently, the CPU 24 transmits a divide request for dividing the read part in the read target chunk file and a copy request for copying the read part to the cloud storage 30 (FIG. 12 (56)). Here, the divide request includes positional information with which a position of the read part (the start-end unprocessed file offsets) in the read target chunk file can be specified.

In the cloud storage 30, the CPU 34 divides the read part from the read target chunk file based on the positional information of the read part included in the divide request, and copies and stores the read part as the file (the read part file) in the auxiliary storage unit 35 (FIG. 12 (57)).

Subsequently, the CPU 24 specifies the processing content (in this example, the compression processing) for the read part file (FIG. 12 (58)) and transmits a request for compressing the read part file (a read part file compression request) to the cloud storage 30 (FIG. 12 (59)).

In the cloud storage 30, the CPU 34 compresses the read part file corresponding to the read part file compression request and causes the read part file to be in the compressed state (FIG. 12 (60)).

Subsequently, the CPU 24 transmits a request for acquiring read part file (a read part file acquire request) to the cloud storage 30 (FIG. 12 (61)).

In the cloud storage 30, the CPU 34 transmits the read part file in the compressed state to the file storage 20 (FIG. 12 (62)).

Subsequently, the CPU 24 acquires the read part file (FIG. 12 (63)), expands the acquired read part file (FIG. 12 (64)), and transmits data of the read part file to a command source of the read command (for example, the computer 10).

As described above, through the file partial update processing of the second scheme according to the embodiment, the read part file in the compressed state is transmitted. Therefore, it is possible to reduce an amount of data transferred between the file storage 20 and the cloud storage 30. In the cloud storage 30, the compression processing or the expansion processing is performed in units of chunks rather than units of files. Therefore, it is possible to reduce a processing load and reduce a processing time.

Next, file partial update processing of updating a part of the read part read to the file storage 20 when the chunk coupled storage is configured in the second scheme will be described.

Figure 13:
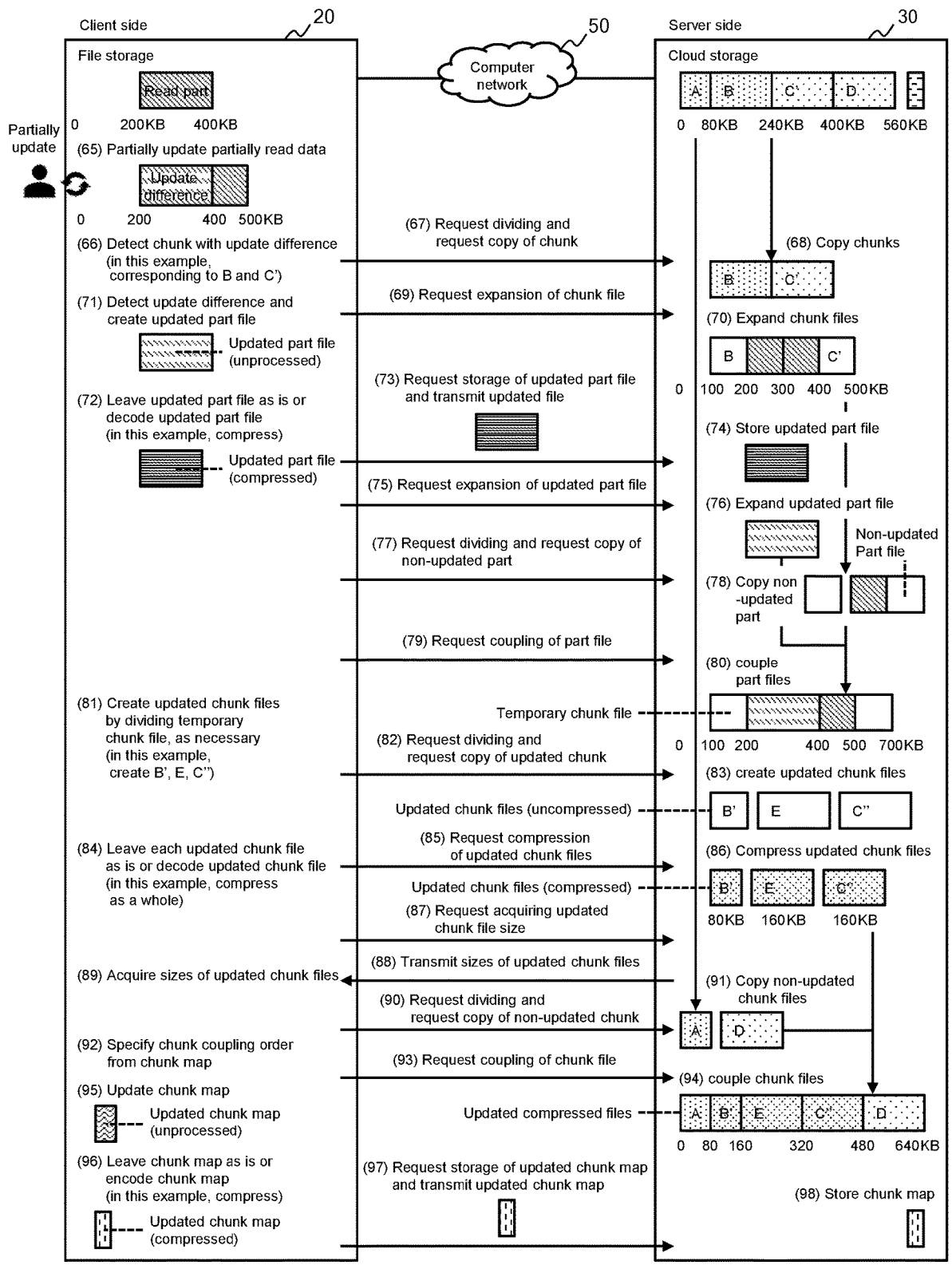
FIG. 13 is a sequence diagram illustrating file partial update processing when the chunk coupled storage is configured in the second scheme according to the embodiment.

FIG. 13 is a sequence diagram illustrating file partial update processing when the chunk coupled storage is configured in the second scheme according to the embodiment.

The file partial update processing is processing performed when a request for updating the read part is received from the computer 10.

When the partial update request for the read part by the user is received from the computer 10, the CPU 24 updates a part which is a target of the partial update request for the read part (FIG. 13 (65)). Data of a part updated in the read part is referred to as an update difference.

Subsequently, the CPU 24 detects chunks with the update difference (an updated chunk) (FIG. 13 (66)). In this example, the chunks B and C' are detected as updated chunks.

Subsequently, the CPU 24 transmits a divide request for dividing a chunk corresponding to the updated chunk (a target chunk) in the compressed file and a copy request for copying the target chunk to the cloud storage 30 (FIG. 13 (67)). Here, the divide request includes information with which the target chunk in the compressed file can be specified.

In the cloud storage 30, the CPU 34 divides the target chunk of the compressed file and copies and stores the target chunk in the auxiliary storage unit 35 (FIG. 13 (68)).

Subsequently, the CPU 24 transmits a request for expanding the target chunk (a chunk file expand request) to the cloud storage 30 (FIG. 13 (69)).

In the cloud storage 30, the CPU 34 performs expansion processing of expanding the target chunk requested from the file storage 20 (FIG. 13 (70)). Through this processing, a file of the target chunk (a target chunk file) is created.

Subsequently, the CPU 24 detects the update difference and creates a file of the part (an updated part) with the update difference (an updated part file) (FIG. 13 (71)). Here, the updated part file is in an unprocessed state.

Subsequently, the CPU 24 performs processing corresponding to the processing content configured for the created updated part file (FIG. 13 (72)). Here, in this example, since compression is configured for the file, the CPU 24 performs compression processing on the file. Here, the updated part file becomes in a compressed state.

Subsequently, the CPU 24 transmits a request for storing the compressed updated part file and transmits the updated part file to the cloud storage 30 (FIG. 13 (73)).

In the cloud storage 30, the CPU 34 stores the updated part file requested from the file storage 20 in the auxiliary storage unit 35 (FIG. 13 (74)).

Subsequently, the CPU 24 transmits a expand request for expanding the updated part file to the cloud storage 30 (FIG. 13 (75)).

In the cloud storage 30, the CPU 34 expands the updated part file corresponding to the expand request (FIG. 13 (76)).

Subsequently, the CPU 24 transmits a divide request for dividing the target chunk file into parts which are not updated (non-updated parts) and a copy request for copying the non-updated parts to the cloud storage 30 (FIG. 13 (77)). Here, the divide request includes positional information with which position of updated parts in the target chunk file can be specified.

In the cloud storage 30, the CPU 34 divides the non-updated parts from the target chunk file based on the positional information included in the divide request, and copies and stores the non-updated parts in the auxiliary storage unit 35 (FIG. 13 (78)).

Subsequently, the CPU 24 transmits a request for coupling the non-updated parts and the updated parts (a part file couple request) to the cloud storage 30 (FIG. 13 (79)).

In the cloud storage 30, the CPU 34 creates temporary chunk files after updated by coupling the non-updated parts and the updated parts (a temporary chunk file) based on the part file couple request (FIG. 13 (80)).

Subsequently, the CPU 24 determines whether to divide the temporary chunk file into a plurality of chunk files (updated chunk files) (FIG. 13 (81)). Here, when the temporary chunk file has a size within a predetermined range, it may be determined that the temporary chunk file is not divided. The divided chunk file may have a size within a pre-decided range or may have a constant size or any size. In this example, it is assumed that the temporary chunk file is determined to be divided into a chunk file B', a chunk file E and a chunk file C".

Subsequently, the CPU 24 transmits a divide request for dividing the temporary chunk file into the determined updated chunk files and a copy request for copying the divided updated chunks to the cloud storage 30 (FIG. 13 (82)).

In the cloud storage 30, the CPU 34 divides the temporary chunk file into the updated chunk files based on the divide request and copies and stores the updated chunk files in the auxiliary storage unit 35 (FIG. 13 (83)).

Subsequently, the CPU 24 specifies the processing content (in this example, compression processing) configured for the updated chunk files (FIG. 13 (84)).

Subsequently, the CPU 24 transmits a request for executing the processing specified for the updated chunk files, in this example, a request for compressing the updated chunk files (an updated chunk file compression request) to the cloud storage 30 (FIG. 13 (85)).

In the cloud storage 30, the CPU 34 compresses the updated chunk files based on the updated chunk file compression request and stores the compressed updated chunk files in the auxiliary storage unit 35 (FIG. 13 (86)).

Subsequently, the CPU 24 transmits a request for acquiring a size of the compressed updated chunk files (a size acquire request) to the cloud storage 30 (FIG. 13 (87)).

In the cloud storage 30, the CPU 34 transmits the size of each compressed updated chunk file in response to the size acquire request to the file storage 20 (FIG. 13 (88)).

Subsequently, the CPU 24 acquires the sizes of the compressed updated chunk files (FIG. 13 (89)).

Subsequently, the CPU 24 transmits a divide request for dividing the non-updated chunk file in the file in the compressed state and a copy request for copying the divided non-updated chunk files to the cloud storage 30 (FIG. 13 (90)).

In the cloud storage 30, the CPU 34 divides the non-updated chunk file with regard to the file based on the divide request and copies and stores the non-updated chunk files in the auxiliary storage unit 35 (FIG. 13 (91)).

Subsequently, the CPU 24 specifies a coupling order of the non-updated chunk files and the updated chunk files based on the chunk map 258B (FIG. 13 (92)).

Subsequently, the CPU 24 transmits a request for coupling the non-updated chunk files and the updated chunk files (an updated chunk file couple request) in the specified coupling order to the cloud storage 30 (FIG. 13 (93)).

In the cloud storage 30, the CPU 34 couples the non-updated chunk files and the updated chunk files to create the updated file based on the updated chunk file couple request and stores the updated file in the auxiliary storage unit 35 (FIG. 13 (94)).

Subsequently, the CPU 24 updates the chunk map 258B to accommodate new chunk content (FIG. 13 (95)).

Subsequently, the CPU 24 determines whether to leave the chunk map 258B as-is or to perform encoding (compressing or encrypting) and perform the determined processing (FIG. 13 (96)). Whether to leave the chunk map 258B as-is or to perform encoding may be determined by default configuration or may be configured or designated by the user, or a determination to perform compression may be made when the chunk map 258B has a predetermined size or more. In this example, it is assumed that a determination to compress the chunk map 258B has been made and the chunk map 258B is compressed.

Subsequently, the CPU 24 transmits a request for storing the updated chunk map 258B and transmits data of the update chunk map 258B to the cloud storage 30 (FIG. 13 (97)).

In the cloud storage 30, the CPU 34 stores the chunk map transmitted from the file storage 20 in the auxiliary storage unit 35 (FIG. 13 (98)).

As described above, through the file partial update processing of the second scheme according to the embodiment, the compressed updated part file is transmitted. Therefore, it is possible to reduce an amount of data transferred between the file storage 20 and the cloud storage 30. In the cloud storage 30, the compression processing or the expansion processing is performed in units of chunks rather than units of files. Therefore, it is possible to reduce a processing load and reduce a processing time.

Next, file initial storage processing when a file (an object when the cloud storage 30 is an object storage) is compressed and managed in a predetermined chunk unit (the second scheme) in the cloud storage 30 and when the chunks are individually to be stored in the cloud storage 30 (when chunk individual storage is configured) will be described.

Figure 14:
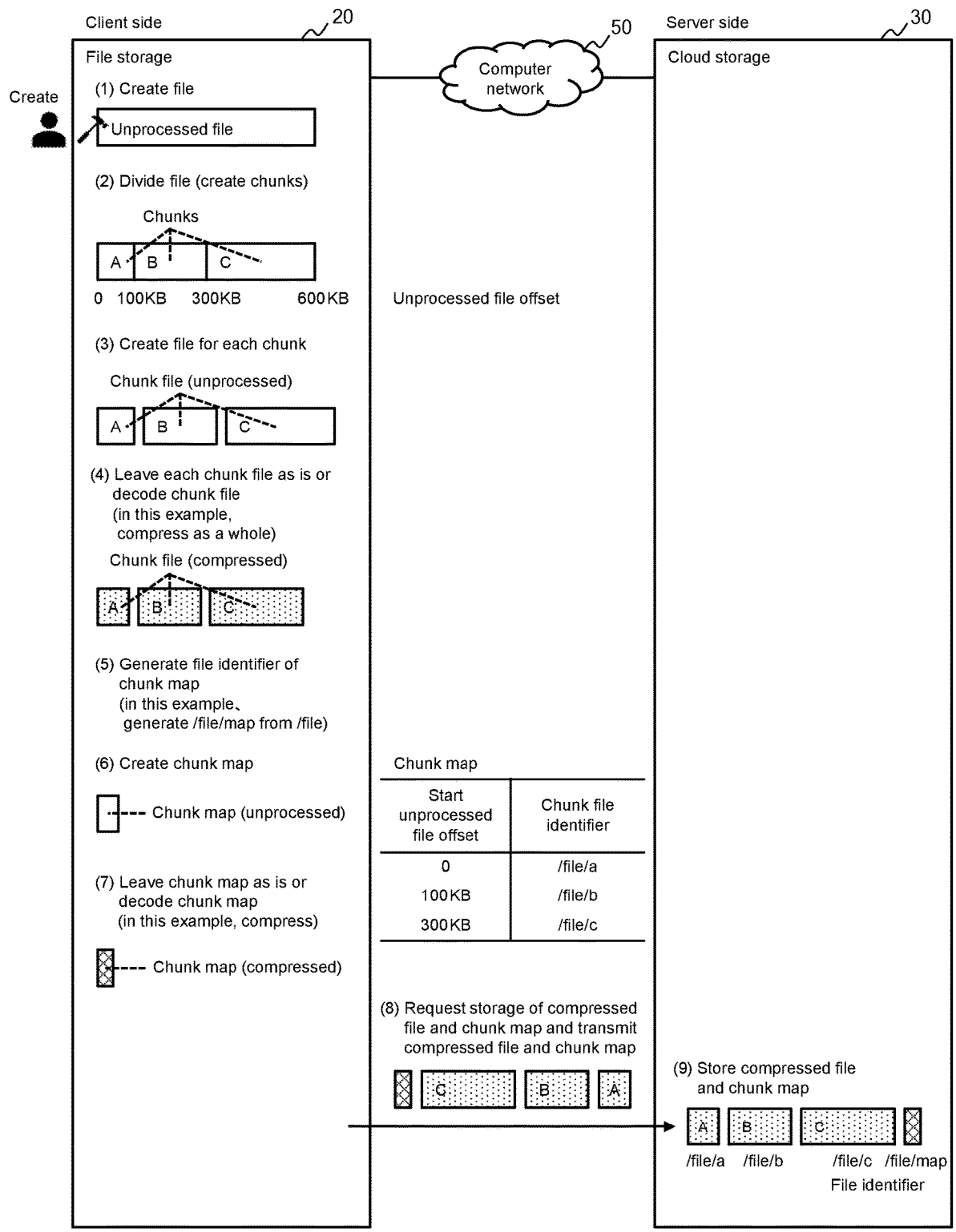
FIG. 14 is a sequence diagram illustrating file initial storage processing when a chunk individual storage is configured in the second scheme according to the embodiment.

FIG. 14 is a sequence diagram illustrating file initial storage processing when a chunk individual storage is configured in the second scheme according to the embodiment.

In the file storage 20, for example, the CPU 24 creates a file in accordance with a instruction by the user from the computer 10. The file created herein is an unprocessed file on which the compression processing or the encrypt processing is not performed (FIG. 14 (1)). An instruction to create the file includes an instruction based on processing in the file storage 20 in addition to the instruction by the user from the computer 10.

Subsequently, the CPU 24 performs processing of dividing the created unprocessed file into a plurality of chunks (FIG. 14 (2)). Here, the chunk may have a size within a pre-decided range, may have a constant size, or may have any size. In this example, the file is divided into a chunk A with an offset range of 0 to 100 KB, a chunk B with an offset range of 100 KB to 300 KB, and a chunk C with an offset range of 300 KB to 600 KB.

Subsequently, the CPU 24 creates each chunk as a file (a chunk file) (FIG. 14 (3)). The chunk file in this state is referred to as an unprocessed chunk file.

Subsequently, the CPU 24 performs processing corresponding to the processing content configured for the chunk for each chunk file (FIG. 14 (4)). Here, the processing content for the chunk may be identical processing content configured in advance as a whole or may be processing content configured for each chunk in accordance with a instruction by the user. In this example, compression processing is assumed to be performed on all the chunks in description.

Subsequently, the CPU 24 generates a file identifier of the chunk map 258B from the file identifier received from the computer 10 as a file name of the file to be created (FIG. 14 (5)). In this example, the CPU 24 generates "/file/map" as a file identifier of the chunk map 258A based on a file identifier "/file".

Subsequently, the CPU 24 creates a file of the chunk map 258A (FIG. 14 (6)). The file of the chunk map 258A is a file on which encode processing has not been performed.

Subsequently, the CPU 24 determines whether to leave the chunk map 258A as-is or to perform encoding (compressing or encrypting) and performs the determined processing (FIG. 14 (7)). Whether to leave the chunk map 258A as-is or to perform encoding may be determined by default configuration or may be configured or designated by the user, or a determination to perform compression may be made when the chunk map 258A has a predetermined size or more. In this example, it is assumed that a determination to compress the chunk map 258A has been made and the chunk map 258A is compressed.

Subsequently, the CPU 24 transmits a request for storing the compressed file and the chunk map and transmits data of the compressed file and the chunk map to the cloud storage 30 (FIG. (8)).

In this example, the chunk map 258A includes an entry in which a start unprocessed file offset is 0 bytes and the chunk file identifier is "/file/a", an entry in which a start unprocessed offset is 100 KB and a file identifier of the chunk file is "/file/b", and an entry in which a start unprocessed offset is 300 KB and a file identifier of the chunk file is "/file/c".

In the cloud storage 30, the CPU 34 separately stores the compressed file and the chunk map transmitted from the file storage 20 in the auxiliary storage unit 35 (FIG. 14 (9)). Here, when the cloud storage 30 is an object storage, the compressed file and the chunk map are each stored as separate objects. When the cloud storage 30 is a file storage, the compressed file and the chunk map are each stored as files. In the cloud storage 30, the chunk file and the chunk map are stored without being encoded.

Next, processing of partially updating a file in the chunk individual coupled storage is configured of the second scheme (partial update processing) will be described.

Figure 15:
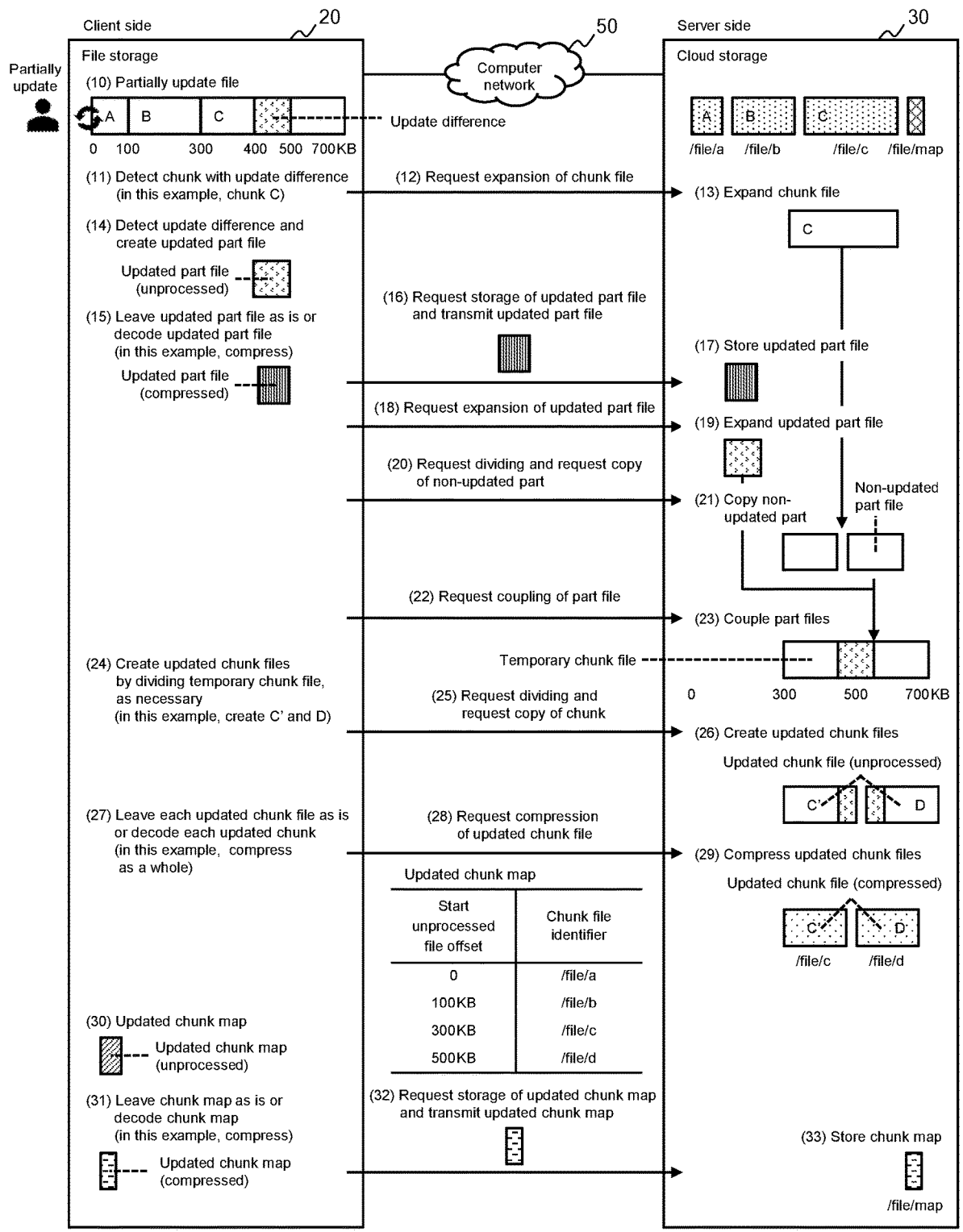
FIG. 15 is a sequence diagram illustrating actual file partial update processing when the chunk individual storage is configured in the second scheme according to the embodiment.

FIG. 15 is a sequence diagram illustrating actual file partial update processing when the chunk individual storage is configured in the second scheme according to the embodiment.

The actual file partial update processing is processing performed when a request for updating the actual file is received from the computer 10.

When the partial update request for the file by the user is received from the computer 10, the CPU 24 updates a part which is a target of the partial update request for the file (FIG. 15 (10)). Data of a part updated in the file is referred to as an update difference.

Subsequently, the CPU 24 detects a chunk with the update difference (an updated chunk) (FIG. 15 (11)). In this example, the chunk C is detected as an updated chunk.

Subsequently, the CPU 24 transmits a request for expanding the chunk (the target chunk) corresponding to the updated chunk (a chunk file expand request) to the cloud storage 30 (FIG. 15 (12)).

In the cloud storage 30, the CPU 34 performs expansion processing of expanding the target chunk requested from the file storage 20 (FIG. 15 (13)). Through this processing, a file of the target chunk (a target chunk file) is created.

Subsequently, the CPU 24 detects the update difference and creates a file of the part (an updated part) with the update difference (an updated part file) (FIG. 15 (14)). Here, the updated part file is in an unprocessed state.

Subsequently, the CPU 24 performs processing corresponding to the processing content configured for the generated updated part file (FIG. 15 (15)). Here, in this example, since compression is configured for the file, the CPU 24 performs compression processing on the updated part file. Here, the updated part file becomes in a compressed state.

Subsequently, the CPU 24 transmits a request for storing the compressed updated part file and transmits the updated part file to the cloud storage 30 (FIG. 15 (16)).

In the cloud storage 30, the CPU 34 stores the updated part file requested from the file storage 20 in the auxiliary storage unit 35 (FIG. 15 (17)).

Subsequently, the CPU 24 transmits a request for expanding the updated part file to the cloud storage 30 (FIG. 15 (18)).

In the cloud storage 30, the CPU 34 expands the updated part file corresponding to the expand request (FIG. 15 (19)).

Subsequently, the CPU 24 transmits a divide request for dividing the target chunk file into parts which are not updated (non-updated parts) and a copy request for copying the non-updated parts to the cloud storage 30 (FIG. 15 (20)). Here, the divide request includes positional information with which position of updated parts in the target chunk file can be specified.

In the cloud storage 30, the CPU 34 divides the non-updated parts from the target chunk file based on the positional information included in the divide request, and copies and stores the non-updated parts in the auxiliary storage unit 35 (FIG. 15 (21)).

Subsequently, the CPU 24 transmits a request for coupling the non-updated parts and the updated parts (a part file couple request) to the cloud storage 30 (FIG. 15 (22)).

In the cloud storage 30, the CPU 34 creates temporary chunk files after updated by coupling the non-updated parts and the updated parts (a temporary chunk file) based on the part file couple request (FIG. 15 (23)).

Subsequently, the CPU 24 determines whether to divide the temporary chunk file into a plurality of chunk files (updated chunk files) (FIG. 15 (24)). Here, when the temporary chunk file has a size within a predetermined range, it may be determined that the temporary chunk file is not divided. The divided chunk file may have a size within a pre-decided range or may have a constant size or any size. In this example, it is assumed that the temporary chunk file is determined to be divided into a chunk file C' and a chunk file D.

Subsequently, the CPU 24 transmits a divide request for dividing the temporary chunk into the determined updated chunk files and a copy request for copying the divided updated chunks to the cloud storage 30 (FIG. 15 (25)).

In the cloud storage 30, the CPU 34 divides the temporary chunk file into the updated chunk files based on the divide request and copies and stores the updated chunk files in the auxiliary storage unit 35 (FIG. 15 (26)).

Subsequently, the CPU 24 specifies the processing content (in this example, compression processing) configured for the updated chunk files (FIG. 15 (27)).

Subsequently, the CPU 24 transmits a request for executing the specified processing for the updated chunk files, in this example, a request for compressing the updated chunk files (an updated chunk file compression request) to the cloud storage 30 (FIG. 15 (28)).

In the cloud storage 30, the CPU 34 compresses the updated chunk files based on the updated chunk file compression request and stores the updated chunk files in the auxiliary storage unit 35 (FIG. 15 (29)).

Subsequently, the CPU 24 updates the chunk map 258A to accommodate new chunk content (FIG. 15 (30)).

Subsequently, the CPU 24 determines whether to leave the chunk map 258A as-is or to perform encoding (compressing or encrypting) and perform the determined processing (FIG. 15 (31)). Whether to leave the chunk map 258A as-is or to perform encoding may be determined by default configuration or may be configured or designated by the user, or a determination to perform compression may be made when the chunk map 258A has a predetermined size or more. In this example, it is assumed that a determination to compress the chunk map 258A has been made and the chunk map 258A is compressed.

Subsequently, the CPU 24 transmits a request for storing the updated chunk map 258A and transmits data of the update chunk map 258A to the cloud storage 30 (FIG. 15 (32)).

In the cloud storage 30, the CPU 34 stores the chunk map transmitted from the file storage 20 in the auxiliary storage unit 35 (FIG. 15 (33)).

As described above, through the file partial update processing of the second scheme according to the embodiment, the compressed updated part file is transmitted. Therefore, it is possible to reduce an amount of data transferred between the file storage 20 and the cloud storage 30. In the cloud storage 30, the compression processing or the expansion processing is performed in units of chunks rather than units of files. Therefore, it is possible to reduce a processing load and reduce a processing time.

Next, processing of reading a part of a file (partial read processing) when a stub file is stored in the file storage 20 in the second scheme, that is, an actual file is not stored or read target data is not stored, will be described.

Figure 16:
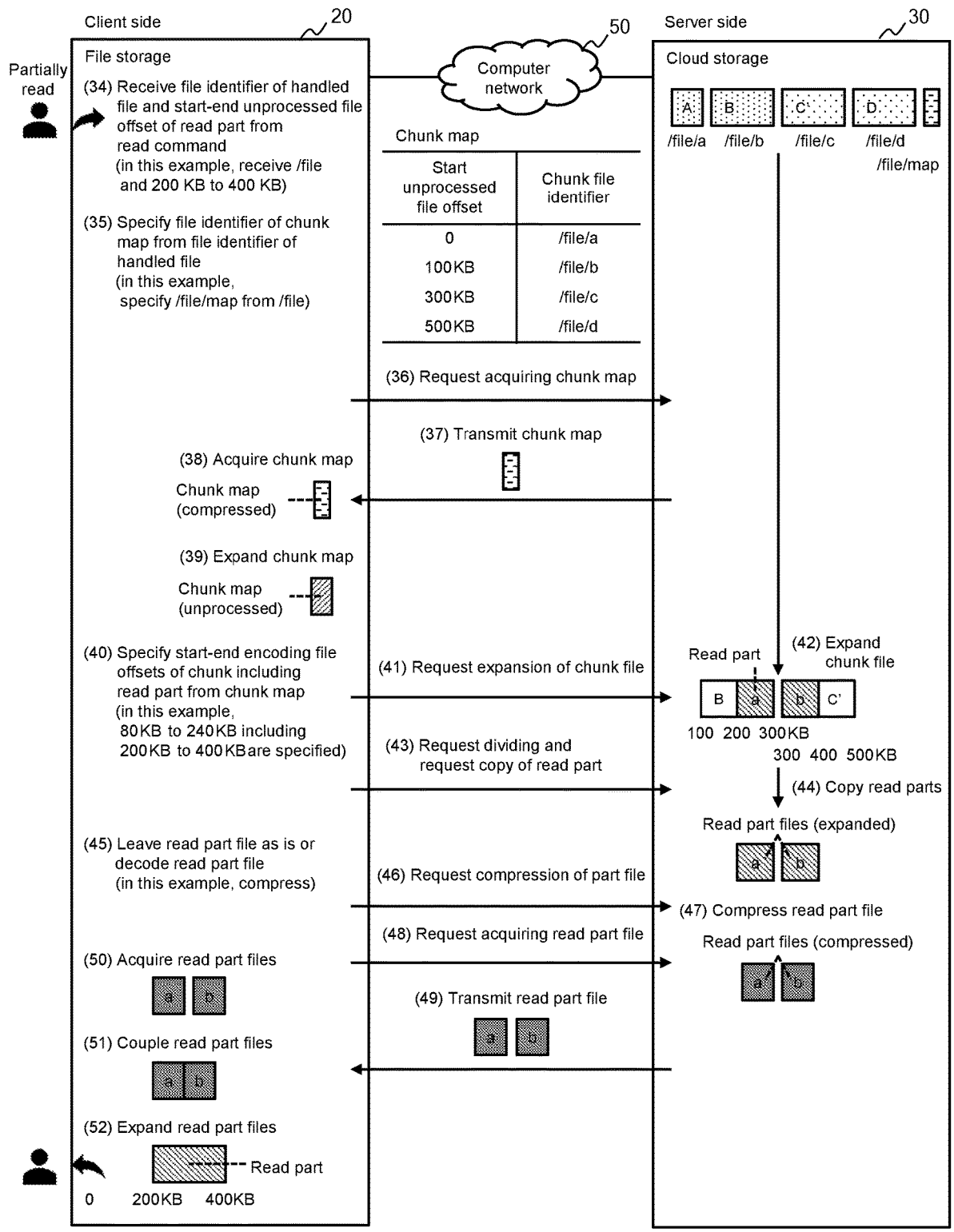
FIG. 16 is a sequence diagram illustrating partial read processing when the chunk individual storage is configured in the second scheme according to the embodiment.

FIG. 16 is a sequence diagram illustrating partial read processing when the chunk individual storage is configured in the second scheme according to the embodiment.

The partial read processing is performed, for example, when the file storage 20 receives a read command to read data of a part of the file as a read target from the computer 10 and there is not data of the part of the read target in the file storage 20. Here, the read command includes a file identifier of the read target file (a handled file) and an offset of a part which is a read target (a read part) in the handled file in the unprocessed state. In this example, it is assumed that the file identifier is "/file" and the offset range is 200 KB to 400 KB in description. The read command includes a command based on processing in the file storage 20 as well as a command based on an instruction by the user from the computer 10.

The CPU 24 of the file storage 20 receives the file identifier and the offset from the read command (FIG. 16 (34)).

Subsequently, the CPU 24 specifies the file identifier of the chunk map 258A from the file identifier of the read target file. In this example, the CPU 24 specifies the file identifier "/file/map" of the chunk map 258B from the file identifier "/file" (FIG. 16 (35)).

Subsequently, the CPU 24 transmits a request for acquiring the chunk map with which the file identifier of the chunk map 258A is designated to the cloud storage 30 (FIG. 16 (36)).

The CPU 34 of the cloud storage 30 acquires the corresponding chunk map 258A from the auxiliary storage unit 35 in response to the request for acquiring the chunk map 258A and transmits the chunk map 258A to the file storage 20 (FIG. 16 (37)).

The CPU 24 of the file storage 20 acquires the chunk map 258A transmitted from the cloud storage 30 (FIG. 16 (38)). Here, in this example, the acquired chunk map is the compressed chunk map 258A stored in FIG. 14 (9). The reason why the chunk map 258A is acquired from the cloud storage 30 is that the latest chunk map 258B is acquired when an identical file is shared with the other file storages 20.

Subsequently, the CPU 24 performs reverse encode processing (in this example, expansion processing) on the chunk map 258A. Thus, the unprocessed chunk map 258A can be acquired (FIG. 16 (39)).

Subsequently, the CPU 24 specifies the file identifiers of one or more chunk files including the read part with reference to the chunk map 258A (FIG. 16 (40)). In this example, since the offset range is 200 KB to 400 KB, the file identifiers "/file/b" and "/file/c" of the chunk files including this range are specified.

Subsequently, the CPU 24 transmits an expand request for expanding the files of the chunk (the read target chunk) including the read part to the cloud storage 30 (FIG. 16 (41)).

In the cloud storage 30, the CPU 34 expands the read target file corresponding to the expand request (FIG. 16 (42)).

Subsequently, the CPU 24 transmits a divide request for dividing the read part in the read target chunk file and a copy request for copying the read part to the cloud storage 30 (FIG. 16 (43)). Here, the divide request includes positional information with which a position of the read part (the start-end unprocessed file offsets) in the read target chunk file can be specified.

In the cloud storage 30, the CPU 34 divides the read part from the read target chunk file based on the positional information of the read part included in the divide request, and copes and stores the read part as the file (the read part file) in the auxiliary storage unit 35 (FIG. 16 (44)).

Subsequently, the CPU 24 specifies the processing content (in this example, the compression processing) in the read part file (FIG. 16 (45)) and transmits a request for compressing the read part file (a read part file compression request) to the cloud storage 30 (FIG. 16 (46)).

In the cloud storage 30, the CPU 34 compresses the read part file corresponding to the read part file compression request and causes the read part file to be in the compressed state (FIG. 16 (47)).

Subsequently, the CPU 24 transmits a request for acquiring read part file (a read part file acquire request) to the cloud storage 30 (FIG. 16 (48)).

In the cloud storage 30, the CPU 34 transmits the read part file in the compressed state to the file storage 20 (FIG. 16 (49)).

Subsequently, the CPU 24 acquires the read part files (FIG. 16 (50)), couples the acquired read part files (FIG. 16 (51)), expands the coupled read part files (FIG. 16 (52)), and transmits data of the expanded read part files to a command source of the read command (for example, the computer 10).

As described above, through the file partial update processing of the second scheme according to the embodiment, the read part file in the compressed state is transmitted. Therefore, it is possible to reduce an amount of data transferred between the file storage 20 and the cloud storage 30. In the cloud storage 30, the compression processing or the expansion processing is performed in units of chunks rather than units of files. Therefore, it is possible to reduce a processing load and reduce a processing time.

Next, file partial update processing of updating a part of the read part read to the file storage 20 when the chunk individual storage is configured in the second scheme will be described.

Figure 17:
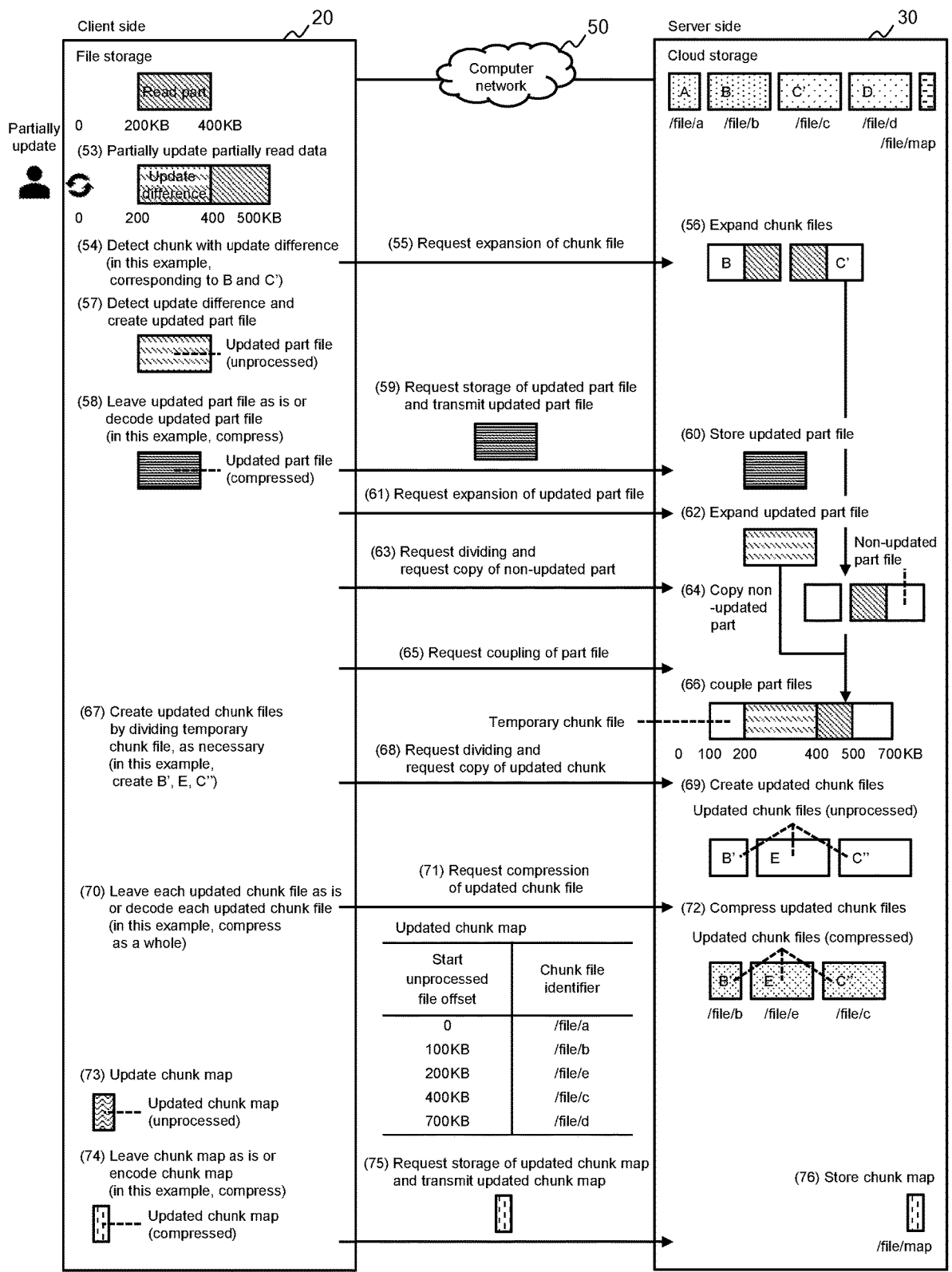
FIG. 17 is a sequence diagram illustrating file partial update processing when the chunk individual storage is configured in the second scheme according to the embodiment.

FIG. 17 is a sequence diagram illustrating file partial update processing when the chunk individual storage is configured in the second scheme according to the embodiment.

The file partial update processing is processing performed when an update request for updating the read part is received from the computer 10.

When the partial update request for the read part by the user is received from the computer 10, the CPU 24 updates a part which is a target of the partial update request for the read part (FIG. 17 (53)). Data of a part updated in the read part is referred to as an update difference.

Subsequently, the CPU 24 detects chunks with the update difference (an updated chunk) (FIG. 17 (54)). In this example, the chunks B and C' are detected as updated chunks.

Subsequently, the CPU 24 transmits a request for expanding the chunk corresponding to the updated chunk (a target chunk) (a chunk file expand request) to the cloud storage 30 (FIG. 17 (55)).

In the cloud storage 30, the CPU 34 performs expansion processing of expanding the target chunk requested from the file storage 20 (FIG. 17 (56)). Through this processing, a file of the target chunk (a target chunk file) is created.

Subsequently, the CPU 24 detects the update difference and creates a file of the part (an updated part) with the update difference (an updated part file) (FIG. 17 (57)). Here, the updated part file is in an unprocessed state.

Subsequently, the CPU 24 performs processing corresponding to the processing content configured for the created updated part file (FIG. 17 (58)). Here, in this example, since compression is configured for the file, the CPU 24 performs compression processing on the file. Here, the updated part file becomes in a compressed state.

Subsequently, the CPU 24 transmits a request for storing the compressed updated part file and transmits the compressed updated part file to the cloud storage 30 (FIG. 17 (59)).

In the cloud storage 30, the CPU 34 stores the updated part file requested from the file storage 20 in the auxiliary storage unit 35 (FIG. 17 (60)).

Subsequently, the CPU 24 transmits a request for expanding the updated part file to the cloud storage 30 (FIG. 17 (61)).

In the cloud storage 30, the CPU 34 expands the updated part file corresponding to the expand request (FIG. 17 (62)).

Subsequently, the CPU 24 transmits a divide request for dividing the target chunk file into parts which are not updated (non-updated parts) and a copy request for copying the non-updated parts to the cloud storage 30 (FIG. 17 (63)). Here, the divide request includes positional information with which position of updated parts in the target chunk file can be specified.

In the cloud storage 30, the CPU 34 divides the non-updated parts from the target chunk file based on the positional information included in the divide request, and copies and stores the non-updated parts in the auxiliary storage unit 35 (FIG. 17 (64)).

Subsequently, the CPU 24 transmits a request for coupling the non-updated parts and the updated parts (a part file couple request) to the cloud storage 30 (FIG. 17 (65)).

In the cloud storage 30, the CPU 34 creates temporary chunk files after updated by coupling the non-updated parts and the updated parts (a temporary chunk file) based on the part file couple request (FIG. 17 (66)).

Subsequently, the CPU 24 determines whether to divide the temporary chunk file into a plurality of chunk files (updated chunk files) (FIG. 17 (67)). Here, when the temporary chunk file has a size within a predetermined range, it may be determined that the temporary chunk file is not divided. The divided chunk file may have a size within a pre-decided range or may have a constant size or any size. In this example, it is assumed that the temporary chunk file is determined to be divided into a chunk file B', a chunk file E and a chunk file C".

Subsequently, the CPU 24 transmits a divide request for dividing the temporary chunk file into the determined updated chunk files and a copy request for copying the divided updated chunks to the cloud storage 30 (FIG. 17 (68)).

In the cloud storage 30, the CPU 34 divides the temporary chunk file into the updated chunk files based on the divide request and copies and stores the updated chunk files in the auxiliary storage unit 35 (FIG. 17 (69)).

Subsequently, the CPU 24 specifies the processing content (in this example, compression processing) configured for the updated chunk files (FIG. 17 (70)).

Subsequently, the CPU 24 transmits a request for executing the specified processing for the updated chunk files, in this example, a request for compressing the updated chunk files (an updated chunk file compression request) to the cloud storage 30 (FIG. 17 (71)).

In the cloud storage 30, the CPU 34 compresses the updated chunk files based on the updated chunk file compression request and stores the updated chunk files in the auxiliary storage unit 35 (FIG. 17 (72)).

Subsequently, the CPU 24 updates the chunk map 258A to accommodate new chunk content (FIG. 17 (73)).

Subsequently, the CPU 24 determines whether to leave the chunk map 258A as-is or to perform encoding (compressing or encrypting) and perform the determined processing (FIG. 17 (74)). Whether to leave the chunk map 258A as-is or to perform encoding may be determined by default configuration or may be configured or designated by the user, or a determination to perform compression may be made when the chunk map 258A have a predetermined size or more. In this example, it is assumed that a determination to compress the chunk map 258A has been made and the chunk map 258A is compressed.

Subsequently, the CPU 24 transmits a request for storing the updated chunk map 258A and transmits data of the update chunk map 258A to the cloud storage 30 (FIG. 17 (75)).

In the cloud storage 30, the CPU 34 stores the chunk map transmitted from the file storage 20 in the auxiliary storage unit 35 (FIG. 17 (76)).

As described above, through the file partial update processing of the second scheme according to the embodiment, the compressed updated part file is transmitted. Therefore, it is possible to reduce an amount of data transferred between the file storage 20 and the cloud storage 30. In the cloud storage 30, the compression processing or the expansion processing is performed in units of chunks rather than units of files. Therefore, it is possible to reduce a processing load and reduce a processing time.

Next, file state transition through each processing in the computer system 1 will be described.

Figure 18:
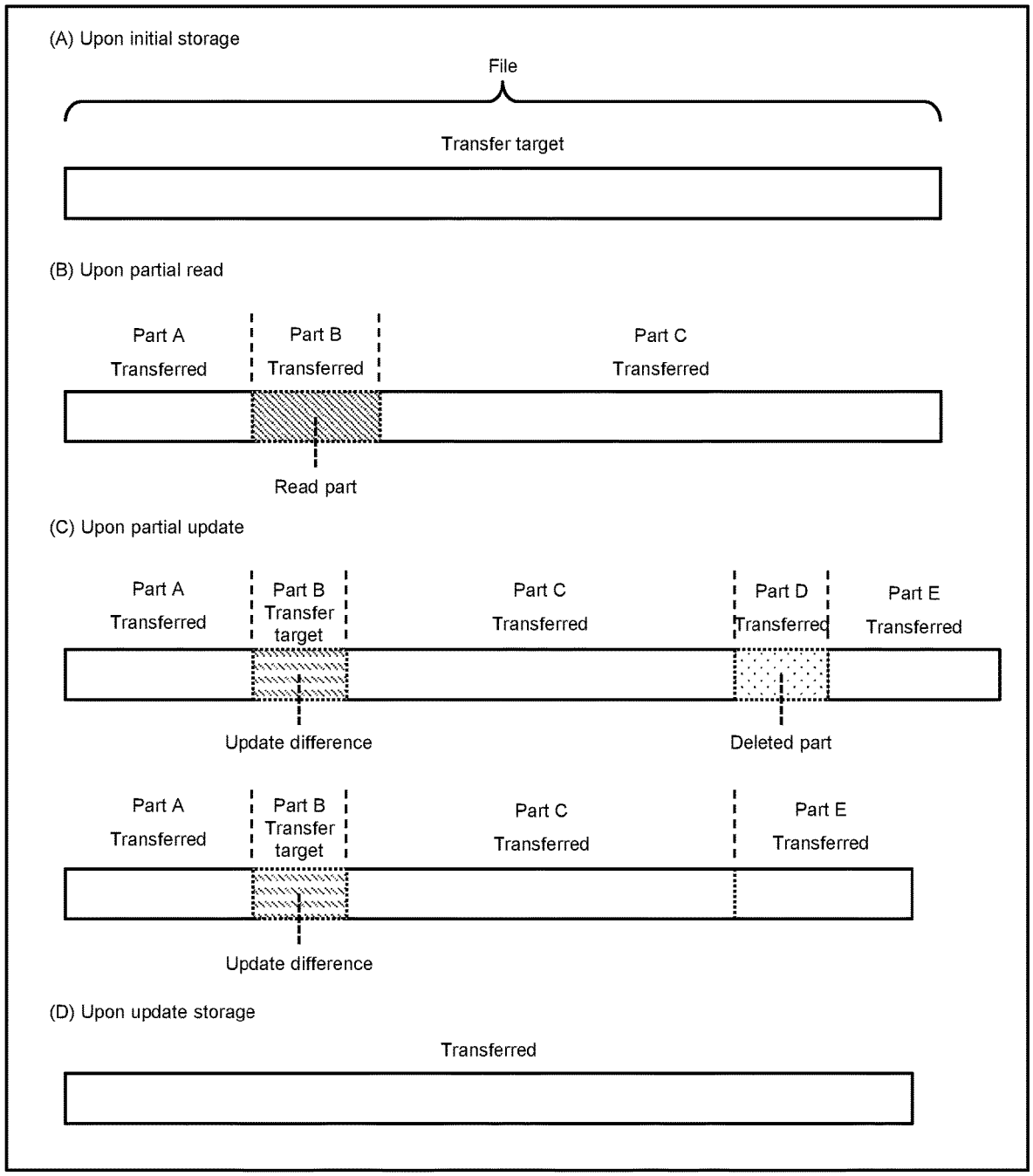
FIG. 18 is a diagram illustrating file state transition in the first scheme according to the embodiment.

FIG. 18 is a diagram illustrating file state transition in the first scheme according to the embodiment. FIG. 18(A) illustrates a file state upon initial storage of the file, FIG. 18(B) illustrates a file state upon partial read, FIG. 18(C) illustrates a file state upon partial update, and FIG. 18(D) illustrates a file state upon update storage. In FIG. 18, a "transfer target" is a target which will be transferred to the cloud storage 30 and a "transferred" is a state in which the transfer to the cloud storage 30 has been completed.

When the initial storage of the file is performed in conformity with the first scheme, as illustrated in FIG. 18(A), all the chunks of the file are transfer targets, and therefore are transferred to in a state in which the files are configured in the processing content in the auxiliary storage unit 35 of the cloud storage 30 (an unprocessed or encoded state).

When the file in the transferred state is partially read, as illustrated in FIG. 18(B), only a read part (in the drawing, a part B) which is a reading target is read from the cloud storage 30 to the file storage 20.

As illustrated in the upper file of FIG. 18(C), a state of the lower file is achieved when the partial update is performed. For example, the part B which is an update difference is a transfer target and is updated. When partially deleted, as indicated in a part D, the part is deleted and updated.

As illustrated in the lower file of FIG. 18(C), when partially updated and then updated and stored in the auxiliary storage unit 35 of the cloud storage 30, the parts A, B, C, and E are stored as one file, as illustrated in FIG. 18(D).

Figure 19:
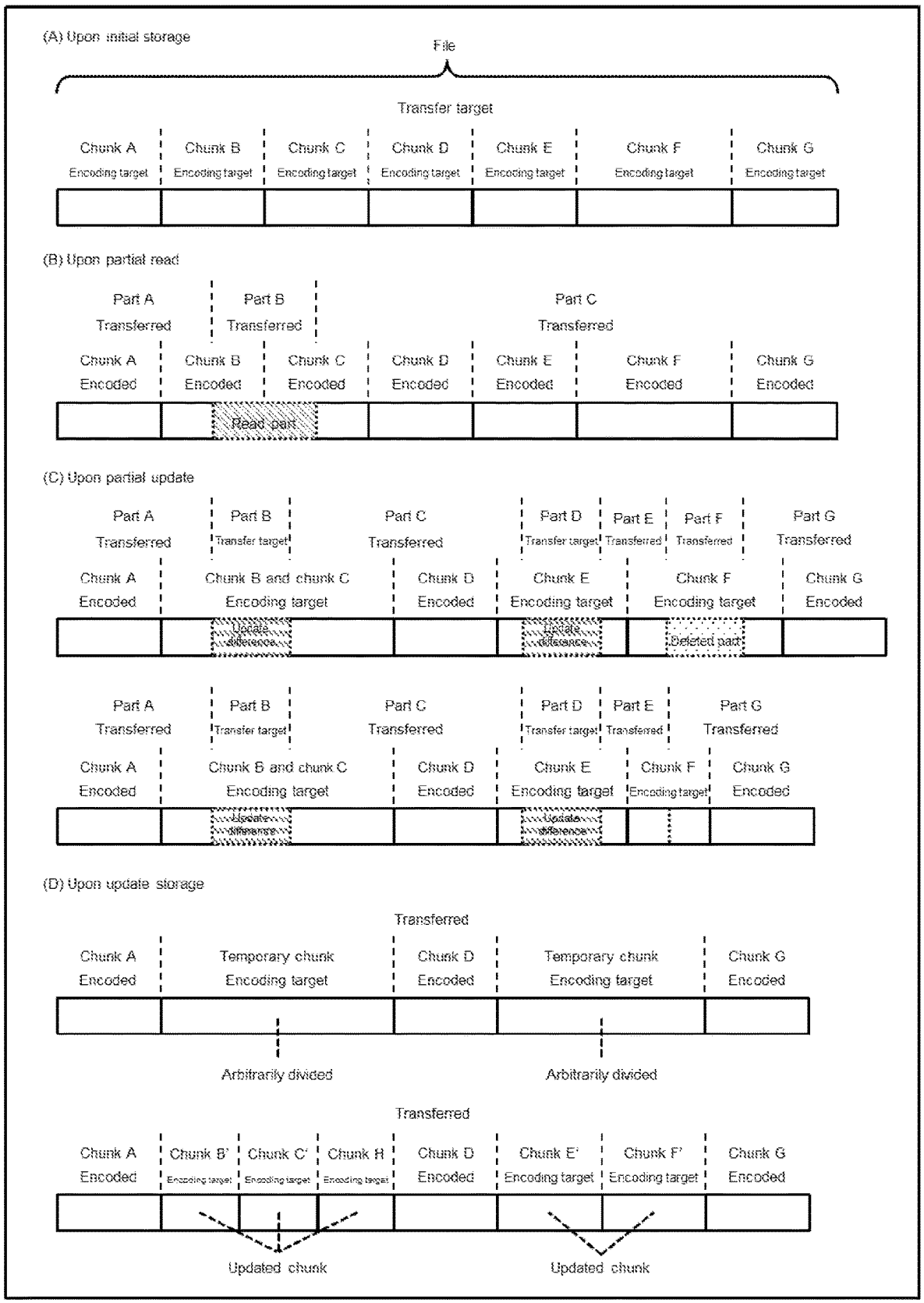
FIG. 19 is a diagram illustrating file state transition in the second scheme according to the embodiment.

FIG. 19 is a diagram illustrating file state transition in the second scheme according to the embodiment. FIG. 19(A) illustrates a file state upon initial storage of a file, FIG. 19(B) illustrates a file state upon partial read, FIG. 19(C) illustrates a file state upon partial update, and FIG. 19(D) illustrates a file state upon update storage. In FIG. 19, a "transfer target" is a target which will be transferred to the cloud storage 30, a "transferred" is a state in which storage to the cloud storage 30 has been completed, an "encoding target" is a target which will be encoded, and an "encoded" indicates a state in which the encoding has been performed.

When the initial storage of the file is performed according to the embodiment, as illustrated in FIG. 19(A), all the chunks of the file are transfer targets, and therefore are stored to in a state in which the each of the chunks included in the file is configured in the processing content in the auxiliary storage unit 35 of the cloud storage 30 (an unprocessed or encoded state). In the embodiment, each chunk is managed as each separate file (or object) in some cases and is coupled and managed as one file (or object) in some cases.

When a file in which the storage of all the chunks is completed is partially read, as illustrated in FIG. 19(B), only read parts in the chunks (in the drawings, the chunks B and C) including the read parts which are read targets are read from the cloud storage 30 to the file storage 20.

As indicated in the upper file of FIG. 19(C), when the partial update is performed, the state of the lower file is achieved. For example, when there are update differences in a part in which the chunks B and C are present, only the update differences are transfer targets and are updated as in the lower file. As indicated in a chunk E, when there is an update difference in one chunk, only the update difference of the chunk becomes a transfer target to be updated. As indicated in a chunk F, when partially deleted, the chunk is updated excluding a deleted part.

As indicated in the lower file of FIG. 19(C), when partially updated and then updated and stored in the auxiliary storage unit 35 of the cloud storage 30, for example, as indicated in the upper file of FIG. 19(D), a file including the chunk A, a temporary chunk, a chunk D, a temporary chunk, and a chunk G is stored as indicated in the lower file of FIG. 19(D). For example, the initial temporary chunk of the upper file of FIG. 19(D) is divided into chunks B', C', and H to be encoded and stored for each chunk. A subsequent temporary chunk is divided into chunks E' and F' to be encoded and stored for each chunk.

Next, various processing operations in the file storage 20 will be described.

First, a processing operation of file initial storage processing in the first scheme will be described.

Figure 20:
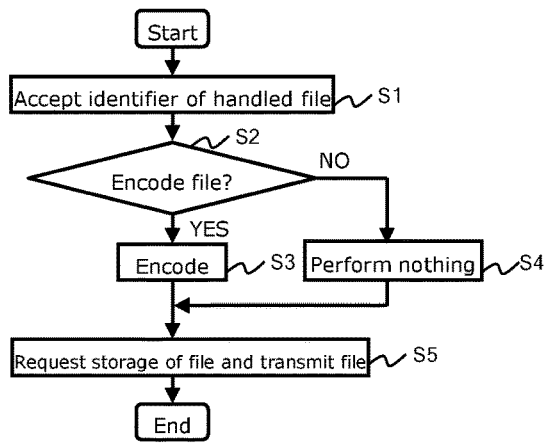
FIG. 20 is a flowchart illustrating file initial storage processing in the first scheme according to the embodiment.

FIG. 20 is a flowchart illustrating the file initial storage processing in the first scheme according to the embodiment.

The CPU 24 of the file storage 20 accepts a designation of the file identifier of a storage target file (a handled file) in the cloud storage 30 from the computer 10 (step S1). The designation of the file identifier includes a designation based on processing in the file storage 20 in addition to a designation by the user from the computer 10.

Subsequently, the CPU 24 determines whether to encode the handled file (step S2). Here, whether to encode the handled file may be determined by default configuration or may be configured or designated by the user, or a determination to encode the handled file may be made when the handled file has a predetermined size or more. When it is determined to encode the handled file (YES in step S2), the CPU 24 performs the encode processing on the handled file (step S3). Conversely, when it is determined not to encode the handled file (NO in step S2), nothing is performed on the chunk file (step S4).

Subsequently, the CPU 24 transmits a handled file storage request to the cloud storage 30 and transmits the handled file (step S5), and the processing ends. Then, the cloud storage 30 stores the file transmitted from the file storage 20 in the auxiliary storage unit 35. A function of the processing in the side of the cloud storage 30 can be realized by a basic function of a general cloud storage.

Next, a processing operation of the partial read processing in the first scheme will be described.

Figure 21:
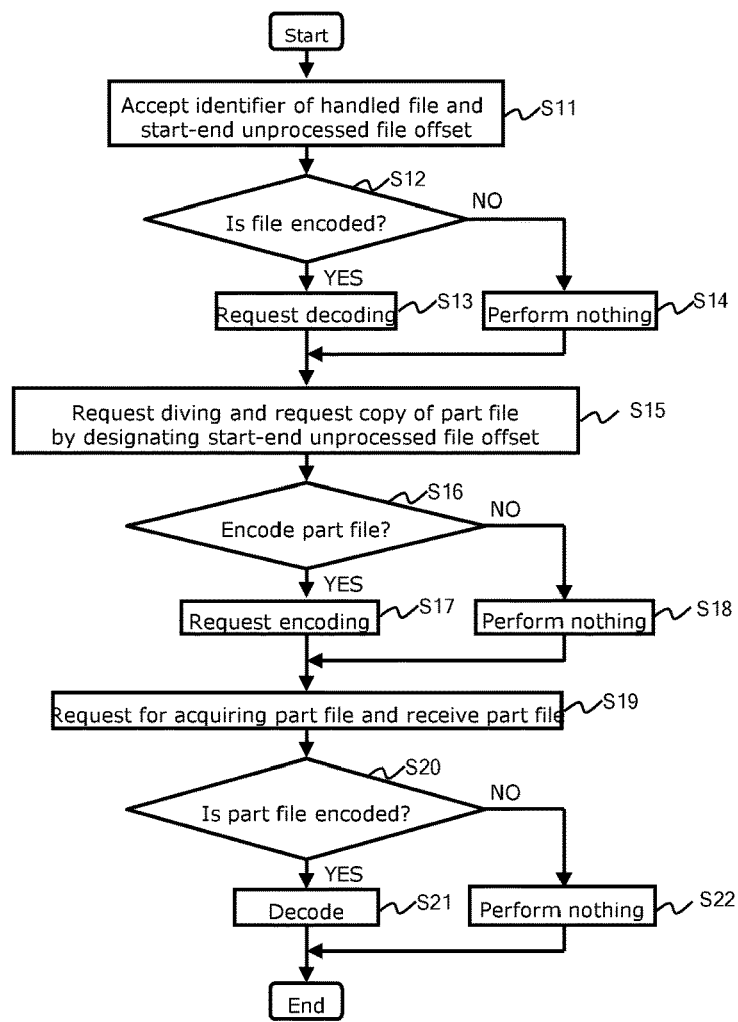
FIG. 21 is a flowchart illustrating partial read processing in the first scheme according to the embodiment.

FIG. 21 is a flowchart illustrating partial read processing in the first scheme according to the embodiment.

The CPU 24 of the file storage 20 accepts a read command for a part of the file by the user from the computer 10 (step S11). Here, the read command includes a file identifier of the read target file (the handled file) and the offset of the read part (the start-end unprocessed file offset) in an unprocessed file.

Subsequently, the CPU 24 determines whether the handled file is encoded in the cloud storage 30 (step S12). When it is determined that the handled file is encoded (YES in step S12), the CPU 24 requests to decode the handled file to the cloud storage 30 (step S13). Conversely, when it is determined that the encoding is not performed (NO in step S12), the CPU 24 performs nothing to the cloud storage 30 (step S14).

Subsequently, the CPU 24 transmits a divide request for dividing the unprocessed file into the files of the read parts (read part files) and a copy request for copying the read part file to the cloud storage 30 (step S15). Here, the divide request includes the positional information (the start-end unprocessed file offset) with which the position of the read part in the unprocessed file can be specified.

Subsequently, the CPU 24 determines whether the read part file is to be encoded (step S16). When it is determined that the read part file is to be encoded (YES in step S16), the CPU 24 requests to encode the read part file to the cloud storage 30 (step S17). Conversely, when it is determined that the read part file is not to be encoded (NO in step S16), the CPU 24 performs nothing to the cloud storage 30 (step S18).

Subsequently, the CPU 24 transmits an acquire request for acquiring the read part file to the cloud storage 30 and receives the read part file from the cloud storage 30 (step S19).

Subsequently, the CPU 24 determines whether the read part file is encoded (step S20). When it is determined that the read part is encoded (YES in step S20), the CPU 24 decodes the read part file (step S21), the CPU 24 returned the decoded read part file to the command source of the read command, and the processing ends. Conversely, when it is determined that the read part file is not encoded (NO in step S20), the CPU 24 performs nothing to the read part file (step S22), returns the read part file to the command source of the read command, and ends the processing.

Next, a processing operation of the partial update processing in the first scheme will be described.

Figure 22:
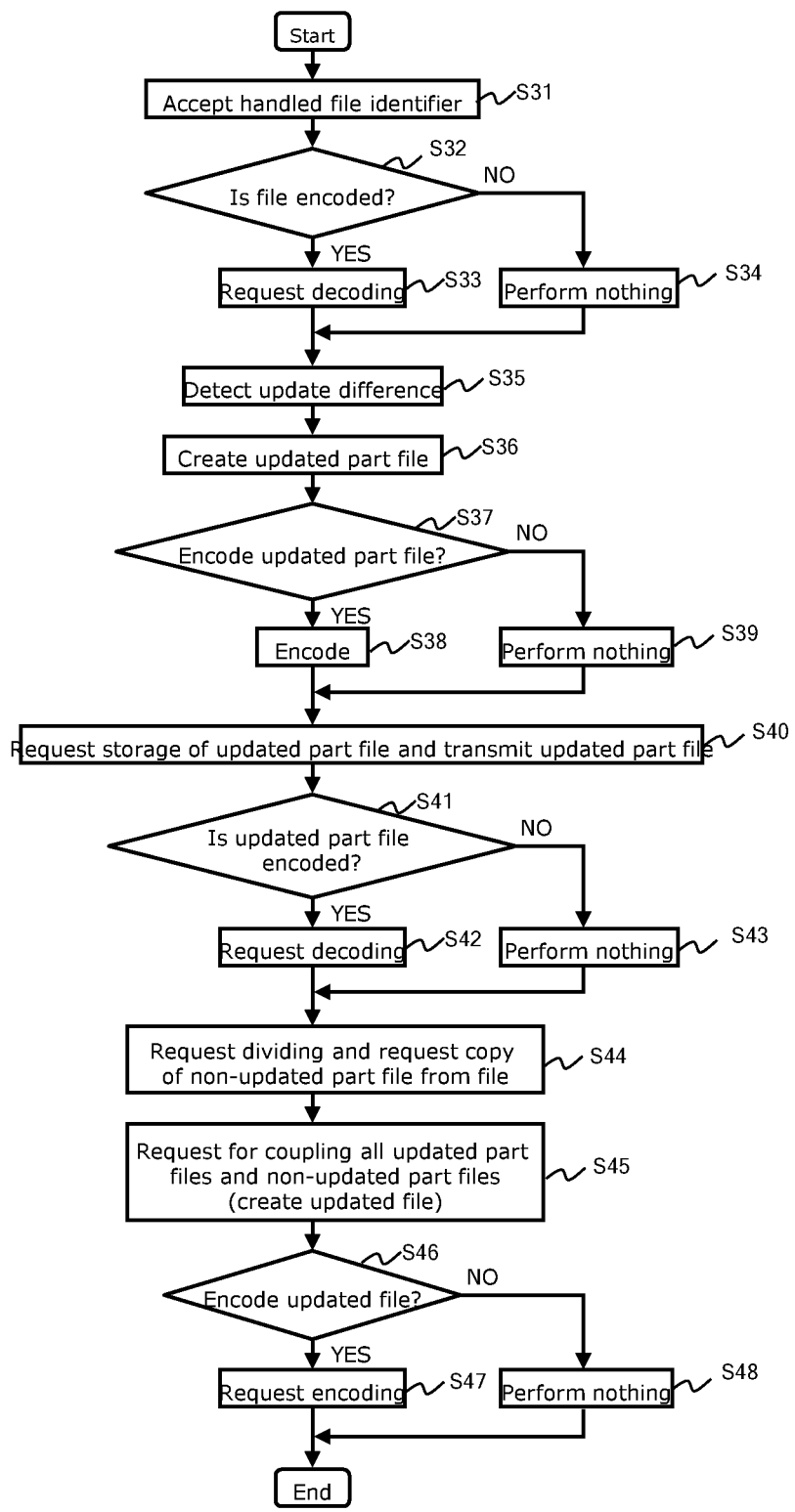
FIG. 22 is a flowchart illustrating partial update processing in the first scheme according to the embodiment.

FIG. 22 is a flowchart illustrating partial update processing in the first scheme according to the embodiment.

The partial update processing is processing performed after the file storage 20 transmits the read part to the computer 10 based on the read command and then the data of the read part from the computer 10 is updated.

The CPU 24 accepts the file identifier of the file to be updated (the handled file) from the user from the computer 10 (step S31).

Subsequently, the CPU 24 determines whether the handled file is encoded in the cloud storage 30 (step S32). When it is determined that the handled file is encoded (YES in step S32), the CPU 24 requests to decode the handled file to the cloud storage 30 (step S33). Conversely, when it is determined that the handled file is not encoded (NO in step S32), the CPU 24 performs nothing to the cloud storage 30 (step S34).

Subsequently, the CPU 24 detects the update difference in the handled file (step S35). The update difference may be detected by performing comparison with the file before the updating or may be detected by receiving updated content.

Subsequently, the CPU 24 creates the updated part file based on the update difference (step S36).

Subsequently, the CPU 24 determines whether the updated part file is to be encoded (step S37). When it is determined that the update part file is to be encoded (YES in step S37), the CPU 24 performs the encode processing to the updated part file (step S38). Conversely, when it is determined that the update part file is not to be encoded (NO in step S37), the CPU 24 performs nothing to the updated part file (step S39).

Subsequently, the CPU 24 transmits a storage request for storing the updated part file to the cloud storage 30 and transmits the updated part file (step S40).

Subsequently, the CPU 24 determines whether the updated part file is encoded in the cloud storage 30 (step S41). When it is determined that the updated part file is encoded (YES in step S41), the CPU 24 requests to decode the updated part file to the cloud storage 30 (step S42). Conversely, when it is determined that the updated part file is not encoded (NO in step S41), the CPU 24 performs nothing to the cloud storage 30 (step S43).

Subsequently, the CPU 24 transmits the divide request for dividing the file of the non-updated part (the non-updated part file) which has not been updated from the unprocessed file and the copy request for copying the non-updated part file to the cloud storage 30 (step S44). Here, the divide request includes the positional information (the start-end unprocessed file offset) with which the position of the updated part in the unprocessed file can be specified. As a result, the non-updated part file is copied to the auxiliary storage unit 35 of the cloud storage 30.

Subsequently, the CPU 24 transmits a couple request for coupling all the updated part files and the non-updated part files to create the updated file to the cloud storage 30 (step S45).

Subsequently, the CPU 24 determines whether the updated file of the cloud storage 30 is to be encoded (step S46). When it is determined that the updated file is to be encoded (YES in step S46), the CPU 24 requests to perform the encode processing for the updated file (step S47) and the processing ends. Conversely, when it is determined that the updated file is to be encoded (NO in step S46), the CPU 24 performs nothing on the updated file (step S48) and the processing ends.

Next, a processing operation of the file initial storage processing in the second scheme will be described.

Figure 23:
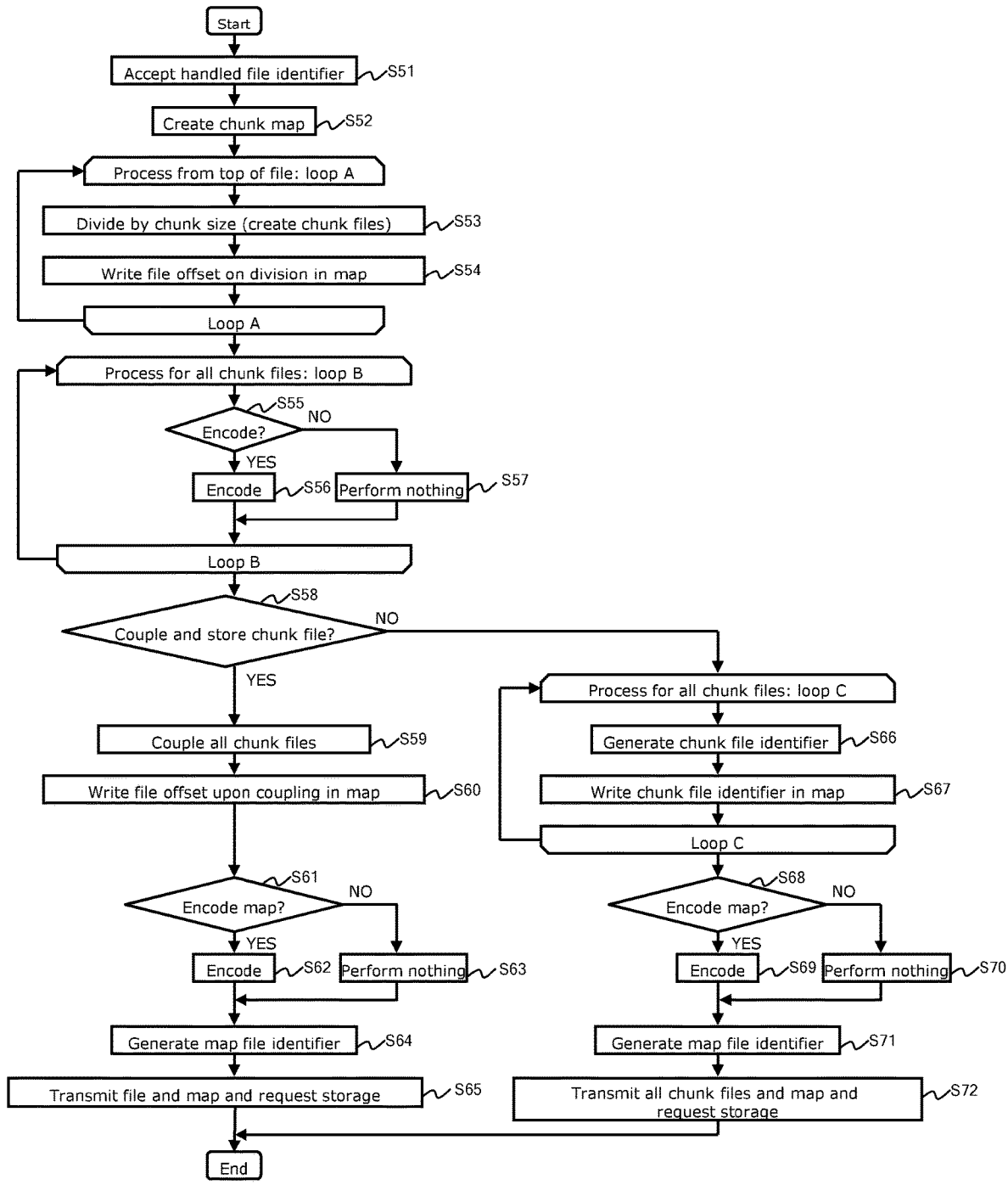
FIG. 23 is a flowchart illustrating file initial storage processing in the second scheme according to the embodiment.

FIG. 23 is a flowchart illustrating the file initial storage processing in the second scheme according to the embodiment.

The CPU 24 of the file storage 20 accepts a designation of the file identifier of a storage target file (a handled file) in the cloud storage 30 from the computer 10 (step S51). The designation of the file identifier includes a designation based on processing in the file storage 20 in addition to a designation by the user from the computer 10.

Subsequently, the CPU 24 created the chunk map 258 corresponding to the handled file (step S52). The chunk map 258 is one of the chunk maps 258A and 258B in accordance with the storage configuration of the handled file in the cloud storage 30.

Subsequently, the CPU 24 repeatedly performs processing (steps S53 and S54) of a loop A on data from the top of a file in order.

In the processing of the loop A, the CPU 24 divides the data of the file with a predetermined chunk size to create the chunk files (step S53) and writes a start offset in the file of the chunk file in the chunk map 258 (step S54).

When there is an unprocessed part in the data of the storage target file, the CPU 24 performs the processing of the loop A on the data from the top of the unprocessed part as a processing target. On the other hand, when the processing of the loop A is performed on all the data of the storage target files, the CPU 24 performs processing (steps S55 to S57) of a loop B on each of the chunks as a processing target.

In the processing of the loop B, the CPU 24 determines whether a processing target chunk file is to be encoded (step S55). Here, whether the chunk file is to be encoded may be determined by default configuration or may be configured or designated by the user, or the chunk file may be determined to be encoded when the chunk file has a predetermined size or more. When it is determined that the processing target chunk file is to be encoded (YES in step S55), the CPU 24 performs the encode processing on the processing target chunk file (step S56). Conversely, when it is determined that the chunk file is not to be encoded (NO in step S55), the CPU 24 performs nothing on the chunk file (step S57).

Subsequently, the CPU 24 performs the processing of the loop B on each chunk file as the processing target. When the processing of the loop B is performed on all the chunk files, the processing proceeds to step S58.

In step S58, the CPU 24 determines whether the chunk files of the chunks included in the file are configured to be coupled into one file (or object) and stored (chunk coupled storage configuration) in the cloud storage 30. As a result, when the chunk coupled storage configuration is configured (YES in step S58), processing upon the chunk coupled storage configuration of steps S59 to S65 is performed. Conversely, when the chunk coupled storage configuration is not configured (NO in step S58), the CPU 24 performs processing upon the chunk coupled storage configuration of steps S66 to S72.

In the processing upon the chunk coupled storage configuration, the CPU 24 couples all the chunk files configuring a storage target file (step S59).

Subsequently, the CPU 24 writes the offset of each chunk file upon coupling on the chunk map 258B (step S60). Specifically, a start offset of each chunk file configuring the file in the file is stored in the start encoded file offset 2591 of each entry corresponding to the chunk file, and an end offset of each chunk file in the file and/or a chunk size after the processing are stored in the end encoded file offset (an encoded chunk size) 2592 of the entry corresponding to each chunk file.

Subsequently, the CPU 24 determines whether the chunk map 258B is configured to be encoded and stored (step S61). When the chunk map 258B is configured to be encoded and stored as a result (YES in step S61), the CPU 24 performs encode processing on the chunk map 258B and the processing proceeds to step S64. Conversely, when the chunk map 258B is not configured to be encoded and stored (NO in step S61), the CPU 24 performs nothing (step S63) and the processing proceeds to step S64.

In step S64, the CPU 24 generates the file identifier of the chunk map 258B based on the accepted file identifier.

Subsequently, the CPU 24 transmits the request for storing the storage target file and the chunk map 258B to the cloud storage 30 and transmits the file and the chunk map 258B (step S65), and ends the processing. Then, the cloud storage 30 stores the file and the chunk map transmitted from the file storage 20 in the auxiliary storage unit 35. A function of the processing in the side of the cloud storage 30 can be realized by a basic function of a general cloud storage.

On the other hand, in the processing upon the chunk individual storage configuration, the CPU 24 performs processing (steps S66 and S67) of a loop C on each of all the chunk files as a processing target.

In the processing of the loop C, the CPU 24 generates the file identifier of a processing target chunk file in the cloud storage 30 (step S66) and writes the generated file identifier on the entry corresponding to the chunk file of the chunk map 258A (step S67). Specifically, the file identifier is stored in the chunk file identifier 2583.

The CPU 24 performs the processing of the loop C on each chunk file as a processing target. When the processing of the loop C is performed on all the chunk files, the processing proceeds to step S68.

In step S68, the CPU 24 determines whether the chunk map 258A is configured to be encoded and stored. When the chunk map 258A is configured to be encoded and preserved as a result (YES in step S68), the CPU 24 performs the encode processing on the chunk map 258A (step S69). When the chunk map 258A is not configured to be encoded and preserved (NO in step S68), the CPU 24 performs nothing (step S70).

Subsequently, the CPU 24 generates the file identifier of the file of the chunk map 258A based on the accepted file identifier (step S71).

Subsequently, the CPU 24 transmits the request for storing all the chunk files of the storage target files and the chunk map 258A to the cloud storage 30, transmits all the chunk files and the chunk map 258A (step S72), and ends the processing. Thus, the cloud storage 30 stores all the chunk files and the chunk map transmitted from the file storage 20 in the auxiliary storage unit 35. A function of the processing in the side of the cloud storage 30 can be realized by a basic function of a general cloud storage.

Next, a processing operation of the partial read processing in the second scheme will be described.

Figure 24:
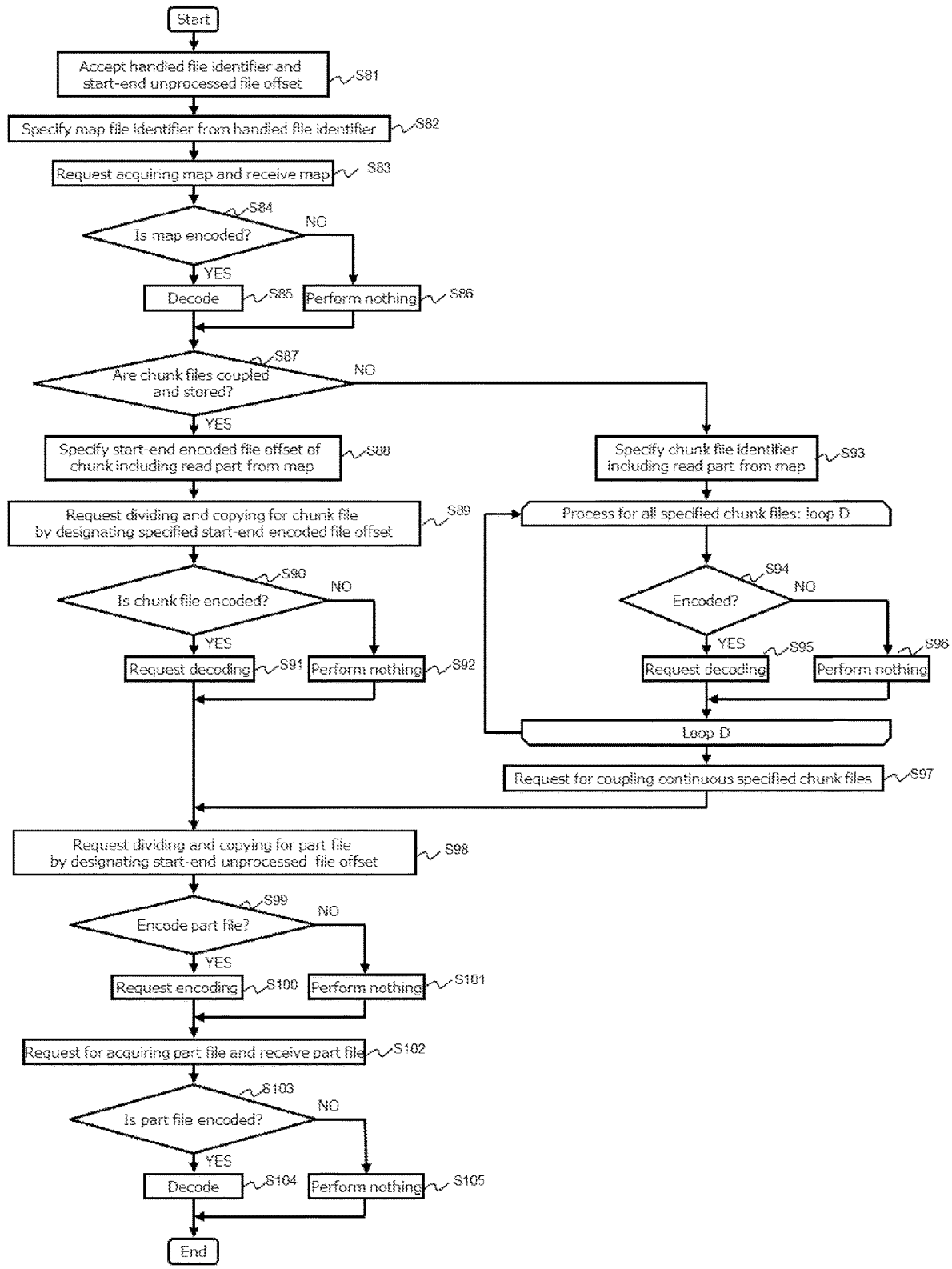
FIG. 24 is a flowchart illustrating partial read processing in the second scheme according to the embodiment.

FIG. 24 is a flowchart illustrating the partial read processing in the second scheme according to the embodiment.

The CPU 24 of the file storage 20 accepts a read command for a part of the file by the user from the computer 10 (step S81). Here, a file identifier of the read target file (the handled file) and the offset of the read part (the start-end unprocessed offset) in an unprocessed file are included in the read command.

Subsequently, the CPU 24 specifies the file identifier of the chunk map 258 (258A or 258B) in the cloud storage 30 from the file identifier of the handled file (step S82). As a method of specifying the file identifier of the chunk map 258, the file identifier may be specified based on a method of generating the file identifier of the chunk map 258 or may be specified with reference to the chunk map 256.

Subsequently, the CPU 24 transmits the request for acquiring the chunk map in which the file identifier of the chunk map 258 is designated to the cloud storage 30 and receives the chunk map 258 from the cloud storage 30 (step S83). A function of the processing in the side of the cloud storage 30 at this time can be realized by a basic function of a general cloud storage.

Subsequently, the CPU 24 of the file storage 20 determines whether the received chunk map 258 is encoded (step S84). When it is determined that the received chunk map 258 is encoded (YES in step S84), reverse encode processing (decode processing) is performed on the received chunk map on the received chunk map (step S85). Conversely, when it is determined that the received chunk map 258 is not encoded (NO in step S84), nothing is performed to the chunk map (step S86). Then, the unprocessed chunk map 258 can be acquired.

Subsequently, the CPU 24 determines whether the chunk files of the chunks configuring the read target file are coupled and stored (step S87). When the chunks are coupled and stored (YES in step S87), the processing upon the chunk coupled storage configuration in steps S88 to S92 and S98 is performed. Conversely, when the chunk files are not coupled and stored (NO in step S87), the CPU 24 performs the processing upon the chunk individual storage configuration in steps S93 to S98. Here, a method of determining whether the chunk files are coupled and stored may be made by specifying whether the chunk map 258 is the chunk maps 258A or 258B based on the configuration of the entry of the chunk map 258 or specifying with reference to the chunk map 256.

In the processing upon the chunk coupled configuration, the CPU 24 specifies the start-end encoded file offsets of one or more (or all) the chunks in the file subjected to the start-end end unprocessed file offset included in the offset of the read target read part from the chunk map 258B (step S88).

Subsequently, the CPU 24 designates transmits a divide request and a copy request for the chunk file to the cloud storage 30 with designating the file identifier of the handled file and the specified start-end encoded file offset (step S89). A function of the processing in the side of the cloud storage 30 at this time can be realized by a basic function of a general cloud storage.

Subsequently, the CPU 24 determines whether the chunk file in the cloud storage 30 is encoded (step S90). When it is determined that the chunk file is encoded (YES in step S90), the CPU 24 requests to reversely encode the chunk file to the cloud storage 30 (step S91). Conversely, when it is determined that the chunk file is not encoded (NO in step S90), the CPU 24 performs nothing to the chunk file in the cloud storage 30 (step S92). Here, whether the chunk file in the cloud storage 30 is encoded may be determined in accordance with a format of the chunk file or may be determined in accordance with the processing content of the chunk map 258.

Subsequently, the CPU 24 transmits the divide request and the copy request for the updated part file to the cloud storage 30 with designating the start-end unprocessed file offset (step S98), and the processing proceeds to step S99.

On the other hand, in the processing upon the chunk individual storage configuration, the CPU 24 specifies the file identifier of the chunk file subjected to the start-end unprocessed file offset included in the offset of the read target read part from the chunk map 258A (step S93).

Subsequently, the CPU 24 performs processing (steps S94 to S96) of a loop D on each of the chunk files corresponding to all the specified file identifiers as a processing target.

In the loop D, the CPU 24 determines whether the processing target chunk file is encoded (step S94). When it is determined that the target chunk file is encoded (YES in step S94), the CPU 24 requests to reversely encode the chunk file to the cloud storage 30 (step S95). Conversely, when it is determined that the target chunk file is not decoded (NO in step S84), the CPU 24 performs nothing to the chunk file in the cloud storage 30 (step S96).

Subsequently, when there is a chunk file which is not the processing target, the CPU 24 performs the processing of the loop D on the chunk file as the processing target. When the processing of the loop D is performed on all the specified chunk files, the processing proceeds to step S97.

In step S97, the CPU 24 transmits a couple request for coupling the continuous chunk files in the specified chunk files to the cloud storage 30.

Subsequently, the CPU 24 transmits the divide request and the copy request for the updated part file to the cloud storage 30 with designating the start-end unprocessed file offset (step S98).

Subsequently, the CPU 24 determines whether the read part file is to be encoded (step S99). When it is determined that the read part file is to be encoded (YES in step S99), the CPU 24 requests to encode the read part file to the cloud storage 30 (step S100). Conversely, when it is determined that the read part file is not to be encoded (NO in step S99), the CPU 24 performs nothing to the cloud storage 30 (step S101).

Subsequently, the CPU 24 transmits the acquire request for acquiring the read part file to the cloud storage 30 and receives the read part file from the cloud storage 30 (step S102).

Subsequently, the CPU 24 determines whether the read part file is encoded (step S103). When it is determined that the read part file is encoded (YES in step S103), the CPU 24 decodes the read part file (step S104), returns the read part file to the command source of the read command, and the processing ends. Conversely, when it is determined that the read part file is not decoded (NO in step S103), the CPU 24 performs nothing on the read part file (step S105), returns the read part file to the command source of the read command, and ends the processing.

Next, a processing operation of the partial update processing in the second scheme will be described.

Figure 25:
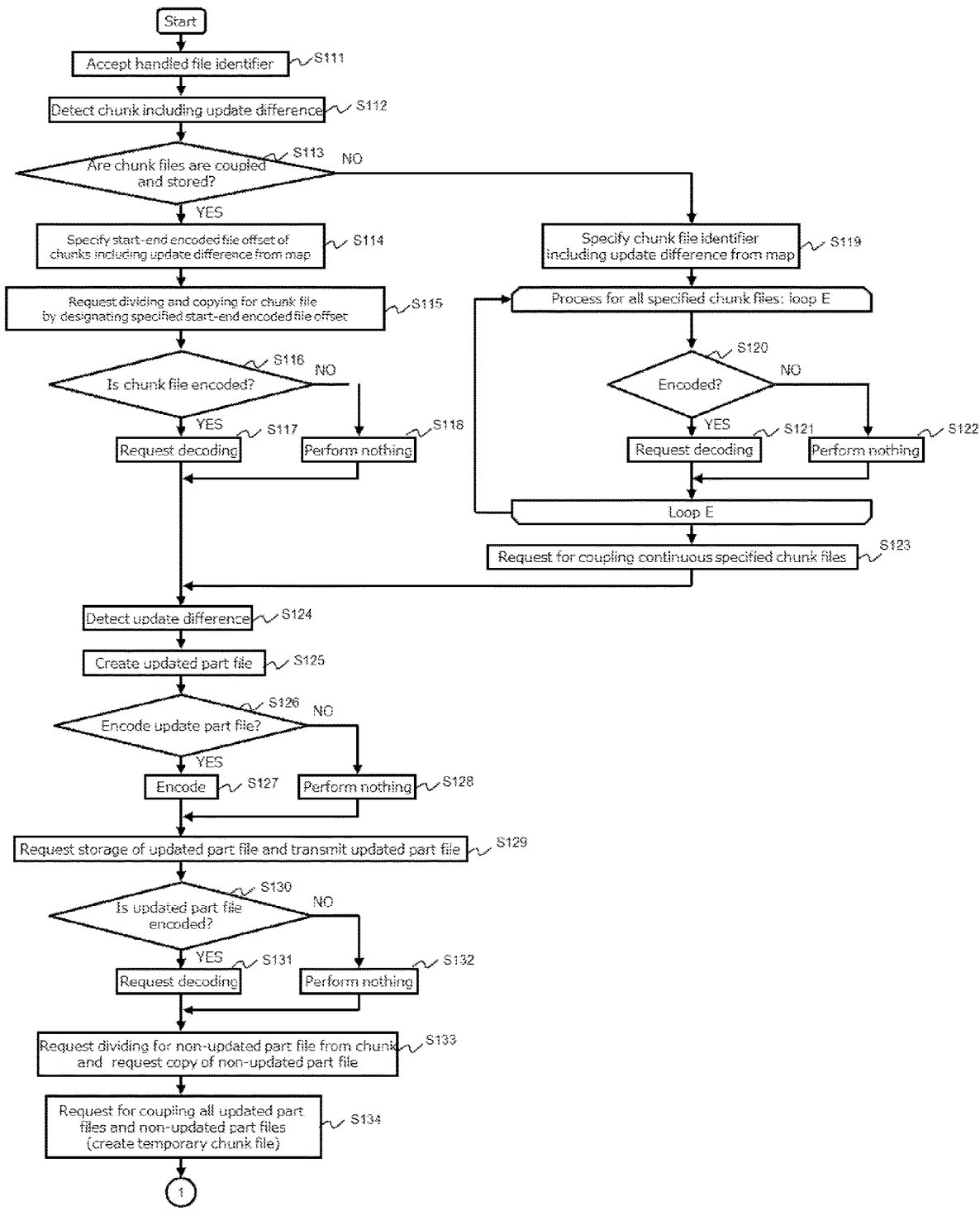
FIG. 25 is a first flowchart illustrating partial update processing in the second scheme according to the embodiment.
Figure 26:
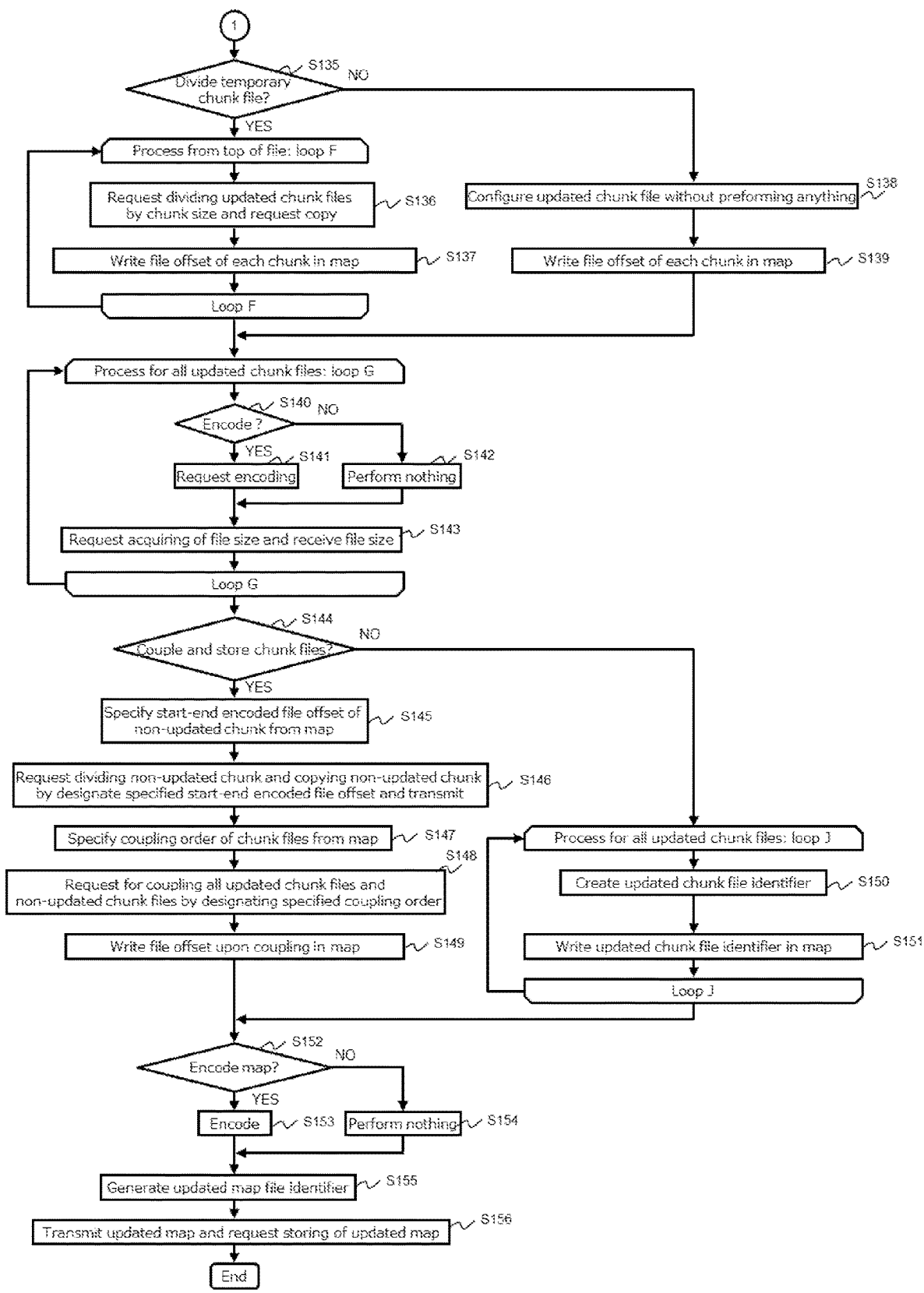
FIG. 26 is a second flowchart illustrating the partial update processing in the second scheme according to the embodiment.

FIG. 25 is a first flowchart illustrating partial update processing in the second scheme according to the embodiment. FIG. 26 is a second flowchart illustrating the partial updating processing in the second scheme according to the embodiment.

The partial update processing is processing performed when the file storage 20 transmits the read part to the computer 10 based on the read command and then an update of data of the read part is received from the computer 10. In this example, processing in a case in which the partial read processing illustrated in FIG. 24 is performed and then the read part is updated will be described.

The CPU 24 accepts the file identifier of a file to be updated (the handled file) from the user from the computer 10 (step S111).

Subsequently, the CPU 24 specifies the update difference from the file and detects chunks including the update difference (step S112).

Subsequently, the CPU 24 determines whether the chunk files of the detected chunks are coupled and stored (step S113). When the chunk files are coupled and stored (YES in step S113), the processing upon the chunk integration preservation configuration in steps S114 to S118 is performed. Conversely, when the chunk files are not coupled and stored (NO in step S113), the CPU 24 performs the processing in the chunk individual storage configuration in steps S119 to S123. Here, a method of determining whether the chunk files are coupled and stored may be made by specifying whether the chunk map 258 is the chunk maps 258A or 258B based on the configuration of the entry of the chunk map 258 or specifying with reference to the chunk map 256.

In the processing upon the chunk coupled storage configuration, the CPU 24 specifies the start-end encoded file offsets of one or more (or all) the chunks in the file subjected to the start-end unprocessed file offset included in the offset of the read target read part from the chunk map 258B (step S114).

Subsequently, the CPU 24 transmits a divide request and a copy request for the chunk file to the cloud storage 30 with designating the file identifier of the handled file and the specified start-end encoded file offset (step S115). A function of the processing in the side of the cloud storage 30 at this time can be realized by a basic function of a general cloud storage.

Subsequently, the CPU 24 determines whether the chunk file in the cloud storage 30 is encoded (step S116). When the chunk file is encoded (YES in step S116), the CPU 24 requests to reversely encode the chunk file to the cloud storage 30 (step S117) and the processing proceeds to step S124. Conversely, when the chunk file is not encoded (NO in step S116), the CPU 24 performs nothing on the chunk file in the cloud storage 30 (step S118) and the processing proceeds to step S124. Here, whether the chunk file in the cloud storage 30 is encoded may be determined in accordance with a format of the chunk file or may be determined in accordance with the processing content of the chunk map 258.

On the other hand, in the processing upon the chunk individual storage configuration, the CPU 24 specifies the file identifier of the chunk file subjected to the start-end unprocessed file offset included in the offset of the read target read part from the chunk map 258A (step S119).

Subsequently, the CPU 24 performs processing (steps S120 to S122) of a loop E on each of the chunk files corresponding to all the specified file identifiers as a processing target.

In the loop E, the CPU 24 determines whether the processing target chunk file is encoded (step S120). When the processing target chunk file is encoded (YES in step S120), the CPU 24 requests to reversely encode the chunk file to the cloud storage 30 (step S121). Conversely, when the processing target chunk file is not encoded (NO in step S120), the CPU 24 performs nothing on the chunk file in the cloud storage 30 (step S122).

Subsequently, when there is a chunk file which is not the processing target, the CPU 24 performs the processing of the loop E on the chunk file as the processing target. When the processing of the loop E is performed on all the specified chunk files, the processing proceeds to step S123.

In step S123, the CPU 24 transmits a request for coupling the continuous chunk files in the specified chunk files to the cloud storage 30 and the processing proceeds to step S124.

In step S124, the CPU 24 detects the update difference in the handled file. The update difference may be detected by performing comparison with the file before the update or may be detected by receiving updated content.

Subsequently, the CPU 24 creates the updated part file based on the update difference (step S125).

Subsequently, the CPU 24 determines whether the updated part file is to be encoded (step S126). When it is determined that the updated part file is to be encode (YES in step S126), the CPU 24 performs the encode processing of encoding the updated part file (step S127). Conversely, when it is determined that the updated part file is not to be decoded (NO in step S126), the CPU 24 performs nothing to the updated part file (step S128).

Subsequently, the CPU 24 transmits a storage request for storing the updated part file to the cloud storage 30 and transmits the updated part file (step S129).

Subsequently, the CPU 24 determines whether the updated part file is encoded in the cloud storage 30 (step S130). When it is determined that the updated part file is encoded (YES in step S130), the CPU 24 requests to decode the updated part file to the cloud storage 30 (step S131). Conversely, when it is determined that the updated part file is not decoded (NO in step S131), the CPU 24 performs nothing to the cloud storage 30 (step S132).

Subsequently, the CPU 24 transmits the divide request for dividing the file of the non-updated part (the non-updated part file) which has not been updated from the unprocessed file and the copy request for copying the non-updated part file to the cloud storage 30 (step S133). Here, the divide request includes the positional information (the start-end unprocessed file offset) with which the position of the updated part in the unprocessed file can be specified. As a result, the non-updated part file is copied to the auxiliary storage unit 35 of the cloud storage 30.

Subsequently, the CPU 24 transmits an couple request for coupling all the updated part files and the non-updated part files to create the temporary chunk file to the cloud storage 30 (step S134).

Subsequently, the CPU 24 determines whether the temporary chunk file is to be divided (step S135). When it is determined that the temporary chunk file is to be divided (YES in step S135), the CPU 24 repeatedly performs processing of a loop F (steps S136 and S137) on the data from the top of the temporary chunk file in order as a processing target. Conversely, when it is determined that the temporary chunk file is not to be divided (NO in step S135), the CPU 24 causes the processing to proceed to step S138.

In the processing of the loop F, the CPU 24 transmits a divide request for dividing data of the temporary chunk file into chunk files with a predetermined chunk size to create the chunk files and a copy request for copying the divided chunk files to the cloud storage 30 (step S136). A function of the processing in the side of the cloud storage 30 at this time can be realized by a basic function of a general cloud storage.

Subsequently, the CPU 24 writes the offset in the file of the chunk file on the chunk map 258 (step S137).

When there is an unprocessed part in the data of the temporary chunk file, the CPU 24 performs the processing of the loop F on the data from the top of the unprocessed part as a processing target. On the other hand, when the processing of the loop F is performed on all the data of the storage target files, the CPU 24 performs processing (steps S140 to S143) of a loop G on each of the chunks.

In step S138, the CPU 24 configures the temporary chunk file as the updated chunk file without performing anything on the temporary chunk file.

Subsequently, the CPU 24 writes the offset in the file of the updated chunk file on the chunk map 258 (step S139) and performs the processing of the loop G (steps S140 to S143) on each chunk as a processing target.

In the processing of the loop G, the CPU 24 determines whether a processing target updated chunk file is to be encoded by the cloud storage 30 (step S140). Here, whether the updated chunk file is to be encoded may be determined by default configuration or may be configured or designated by the user, or the chunk file may be determined to be encoded when the updated chunk file has a predetermined size or more. When it is determined that the processing target updated chunk file is to be encoded (YES in step S140), the CPU 24 requests the cloud storage 30 to perform the encode processing on the processing target updated chunk file (step S141). Conversely, when it is determined that the processing target updated chunk file is not to be encoded (NO in step S140), the CPU 24 performs nothing on the updated chunk file of the cloud storage 30 (step S142).

Subsequently, the CPU 24 transmits an acquire request for acquiring the file size of the updated chunk file to the cloud storage 30 and receives the file size of the updated chunk file from the cloud storage 30 (step S143).

Subsequently, the CPU 24 performs the processing of the loop G on each updated chunk file as a processing target. When the processing of the loop G is performed on all the updated chunk files, the processing proceeds to step S144.

In step S144, the CPU 24 determines whether the chunk files are to be coupled and stored. When the chunk files are to be coupled and stored (YES in step S144), processing upon the chunk integration storage configuration in steps S145 to S149 is performed. Conversely, when the chunk files are not to be coupled and stored (NO in step S144), the CPU 24 performs processing of a loop J (steps S150 and S151), that is, the processing upon the chunk individual storage configuration. Here, a method of determining whether to couple and store the chunk files may be made by specifying whether the chunk map 258 is the chunk maps 258A or 258B based on the configuration of the entry of the chunk map 258 or specifying with reference to the chunk map 256.

In the processing upon the chunk coupled storage configuration, the CPU 24 specifies the start-end encoded file offset of the non-updated chunk from the chunk map 258B (step S145).

Subsequently, the CPU 24 transmits a divide request for dividing the non-updated chunk file from the handled file and a copy request for copying the non-updated chunk to the cloud storage 30 with designating the file identifier of the handled file and the specified start-end encoded file offset (step S146). A function of the processing in the side of the cloud storage 30 at this time can be realized by a basic function of a general cloud storage.

Subsequently, the CPU 24 specifies a coupling order of the updated chunk files and the non-updated chunk files of the handled file from the chunk map 258B (step S147).

Subsequently, the CPU 24 transmits a coupling request for coupling all the updated chunk files and the non-updated chunk files in the specified coupling order to the cloud storage 30 (step S148).

Subsequently, the CPU 24 writes the file offset of each chunk file upon the integration on the chunk map 258B (step S149) and the processing proceeds to step S152.

On the other hand, in the processing upon the chunk individual storage configuration (the loop J), the CPU 24 generates the identifier of the updated chunk file (the updated chunk file identifier) (step S150) and writes the generated updated chunk file identifier on the chunk map 258A (step S151).

Subsequently, when there is an updated chunk file which is not the processing target, the CPU 24 configures the updated chunk file as a processing target and performs the processing of the loop J. When the processing of the loop J is performed on all the updated chunk files, the processing proceeds to step S152.

In step S152, the CPU 24 determines whether the chunk map 258 is configured to be encoded and stored. When it is determined that the chunk map 258 is configured to be encoded and stored as a result (YES in step S152), the CPU 24 performs an encoding processing on the chunk map 258 and the processing proceeds to step S155. Conversely, when the chunk map 258 is not configured to be encoded and stored (NO in step S152), the CPU 24 performs nothing (step S154) and the processing proceeds to step S155.

In step S155, the CPU 24 generates the file identifier of the updated chunk map 258 based on the accepted file identifier.

Subsequently, the CPU 24 transmits the storage request for storing the chunk map 258 to the cloud storage 30, transmits the chunk map 258 (step S156), and ends the processing. Then, the cloud storage 30 stores the chunk map transmitted from the file storage 20 in the auxiliary storage unit 35.

The present invention is not limited to the foregoing embodiment and can be appropriately modified within the scope of the present invention without departing from the gist of the present invention.

For example, in the foregoing embodiment, the file storage 20 can be configured to switch whether the chunks included in the file are coupled and stored in the cloud storage 30 in accordance with configuration. However, the present invention is not limited thereto. The file storage 20 may be configured to be fixed to one of whether the chunks included in the file are coupled and stored or are stored without being coupled.

In the foregoing embodiment, the compression processing and/or the encryption processing has been described mainly as the encode processing, but the present invention is not limited thereto. Another encode processing may be included. For example, processing of calculating and adding an error correction code (ECC) to data or processing of calculating and adding an erasure correction code may be included.

The functions of the file storage 20 in the foregoing embodiment may be embedded in the computer 10 used by the user. In this way, when the functions of the file storage 20 are embedded in the computer 10, the computer 10 is equivalent to the file storage in the claims. For example, when the functions of the file storage 20 are embedded in the computer 10 used by the user, the file storage 20 may not be included in the computer system 1.

In the forgoing embodiments, some or all of the steps of processing performed by the CPU may be performed by a hardware circuit. The program according to the foregoing embodiments may be installed from a program source. The program source may be, for example, a program distribution server or a storage medium (for example, a portable recording medium) which can be read by a computer.

What is claimed is:

1. A file storage, that is coupled to a data storage storing data, and that manages a first file, wherein the data storage compresses and stores data of the first file, the file storage comprising:
    a processor; and
    a memory storing instructions that when executed by the processor configures the processor to:
    update a part of the first file with update data,
    transmit a first request to the data storage to decompress the compressed first file stored on the data storage,
    create a second file, which is different than the first file, and is the updated part of the first file,
    compress the second file and transmit the compressed second file to the data storage,
    transmit a second request to the data storage to decompress the compressed second file,
    transmit a third request to divide the decompressed first file into at least two non-updated parts, the third request including a division position of the decompressed first file,
    transmit a fourth request to create an updated uncompressed file consisting of the at least two non-updated parts and the decompressed second file, and
    transmit a fifth request to compress the updated uncompressed file and store in a compressed state.

2. The file storage according to claim 1,
wherein the processor is configured to:
upon receiving a read command including positional information of a read target part of a read target file in a non-compressed state and stored in the data storage, transmit the positional information of the read target part in the non-compressed state to the data storage,
acquire data of the read target part in the compressed state from the data storage,
expand and hold the data of the read target part in the compressed state, and
accept at least a partial update of the read target part.

3. The file storage according to claim 2,
wherein the data storage compresses and stores each of a plurality of chunks constituting the file,
wherein upon receiving the read command including positional information of the read target part of the read target file in a non-compressed state and the file storage has not stored data of the read target part of the file, send one or more sixth requests to the data storage to cause the data storage to expand a chunk including data of the read target part, specify the data of the read target part in the non-compressed state from the expanded chunk, compress the data of the read target part so that the data of the read target part is in the compressed state, and transmit the data of the read target part in the compressed state to the file storage.

4. The file storage according to claim 3,
wherein the data storage stores a chunk map indicating positional information with which a position of the chunk in the file is specified, and
wherein the processor is configured to acquire the chunk map from the data storage, specify a chunk including the data of the read target part, based on the chunk map, and expand the specified chunk.

5. A computer system comprising:
a data storage storing data; and
a file storage managing a first file,
wherein the data storage compresses and stores data of the first file,
wherein the file storage includes a first processor,
wherein the data storage includes a second processor,
wherein the first processor of the file storage is configured to, update a part of the first file with updated data,
transmit a first request to the data storage to decompress the compressed first file stored on the data storage,
wherein the second processor is configured to, in response to the first request, decompress the first file stored in the data storage,
wherein the first processor is configured to:
create a second file, which is different than the first file, and is the updated part of the first file,
compress the second file, transmit the compressed second file to the data storage, and
transmit a second request to the data storage to decompress the compressed second file,
wherein the second processor is configured to, in response to receiving the second request, decompress the second file,
wherein the first processor is configured to transmit a third request to divide the decompressed first file into at least two non-updated parts, the third request including a division position of the decompressed first file,
wherein the second processor is configured to, in response to the third request, divide the decompressed first file into the at least two non-updated parts,
wherein the first processor is configured to transmit a fourth request to create an updated uncompressed file consisting of the at least two non-updated parts and the decompressed second file, and
wherein the second processor is configured to, in response to the fourth request, create the updated uncompressed file consisting of the at least two non-updated parts and the decompressed second file,
wherein the first processor is configured to transmit a fifth request to compress the updated uncompressed file and store in a compressed state, and
wherein the second processor is configured to, in response to the fifth response, compress the updated uncompressed file and store in the compressed file in the compressed state.

6. The computer system according to claim 5,
wherein the first processor of the file storage is configured to, upon receiving a read command including positional information of a read target part of the target file in a non-compressed state and stored in the data storage has been received, transmit the positional information of the read target part in the non-compressed state to the data storage,
wherein the second processor of the data storage is configured to:
specify and compress data of the read target part of the file so that the data of the read target part is in a compressed state, based on the positional information, and
transmit data of the read target part in the compressed state to the file storage, and
wherein the first processor of the file storage is configured to:
receive the data of the read target part in the compressed state,
expand and hold the data of the read target part in the compressed state, and
receive at least a partial update of the read target part.

7. The computer system according to claim 5,
wherein the data storage compresses and stores each of a plurality of chunks constituting the file, and
wherein the second processor of the data storage is configured to store a chunk including the update part data in the compressed state.

8. The computer system according to claim 6,
wherein the data storage compresses and stores each of a plurality of chunks constituting the file, and
wherein the second processor of the data storage is configured to expand a chunk including data of the read target part, specify the data of the read target part in the non-compressed state from the expanded chunk, compress the data of the read target part so that the data of the read target part is in a compressed state, and transmit the data of the read target part in the compressed state to the file storage.

* * * * *